(12) United States Patent
Masuoka et al.

(10) Patent No.: US 7,940,573 B2
(45) Date of Patent: May 10, 2011

(54) NONVOLATILE SEMICONDUCTOR MEMORY AND METHOD FOR DRIVING THE SAME

(75) Inventors: Fujio Masuoka, Chuo-ku (JP); Hiroki Nakamura, Chuo-ku (JP)

(73) Assignees: Unisantis Electronics (Japan) Ltd., Tokyo (JP); Tohoku University, Miyagi (JP)

( * ) Notice: Subject to any disclaimer, the term of this patent is extended or adjusted under 35 U.S.C. 154(b) by 133 days.

(21) Appl. No.: 12/319,770

(22) Filed: Jan. 12, 2009

(65) Prior Publication Data

US 2009/0161441 A1  Jun. 25, 2009

Related U.S. Application Data

(63) Continuation of application No. PCT/JP2007/063888, filed on Jul. 12, 2007.

(30) Foreign Application Priority Data

Jul. 12, 2006 (JP) .................................. 2006-191469

(51) Int. Cl.
*G11C 16/04* (2006.01)

(52) U.S. Cl. ......... 365/185.29; 365/185.21; 365/185.18; 365/185.03

(58) Field of Classification Search ............. 365/185.29, 365/185.21, 185.18, 185.03
See application file for complete search history.

(56) References Cited

U.S. PATENT DOCUMENTS

| | | | |
|---|---|---|---|
| 5,654,920 A * | 8/1997 | Watsuji et al. | 365/185.27 |
| 6,144,584 A | 11/2000 | Kunori et al. | |
| 6,240,016 B1 * | 5/2001 | Haddad et al. | 365/185.18 |
| 6,377,070 B1 | 4/2002 | Forbes | |
| 6,493,265 B2 * | 12/2002 | Satoh et al. | 365/185.21 |
| 7,259,992 B2 * | 8/2007 | Shirota | 365/185.21 |

(Continued)

FOREIGN PATENT DOCUMENTS

JP  1-173652 A  7/1989

(Continued)

OTHER PUBLICATIONS

International Search Report issued Sep. 18, 2007 in International application No. PCT/JP2007/063888 3 pages.
Ohba, et al. "A novel tri-control gate surrounding gate transistor (TCG-SGT) nonvolatile memory cell for flash memory", Solid-State Electronics, vol. 50 (2006), pp. 924-928.

(Continued)

*Primary Examiner* — Connie C Yoha
(74) *Attorney, Agent, or Firm* — Brinks Hofer Gilson & Lione

(57) ABSTRACT

To provide a NOR-type nonvolatile semiconductor memory that can inject electric charge into a charge accumulation layer through the use of an FN tunnel current without compromising an increase in the packing density of memory cells. The above problem is solved by a nonvolatile semiconductor memory in which nonvolatile semiconductor memory cells are arranged in a matrix, each nonvolatile semiconductor memory cell having an island semiconductor layer in which a drain diffusion layer formed in the upper part of the island semiconductor layer, a source diffusion layer formed in the lower part of the island semiconductor layer, a charge accumulation layer formed on a channel region of the side wall sandwiched between the drain diffusion layer and the source diffusion layer via a gate insulation film, and a control gate formed on the charge accumulation layer are formed. Further, bit lines connected to the drain diffusion layer are laid out in a column direction, control gate lines are laid out in a row direction, and source lines connected to the source diffusion layer are laid out in the column direction.

15 Claims, 31 Drawing Sheets

U.S. PATENT DOCUMENTS

| | | |
|---|---|---|
| 2004/0026748 A1 | 2/2004 | Goda et al. |
| 2004/0164342 A1 | 8/2004 | Forbes et al. |
| 2005/0012134 A1 | 1/2005 | Masuoka et al. |

FOREIGN PATENT DOCUMENTS

| | | |
|---|---|---|
| JP | 4-302477 A | 10/1992 |
| JP | 6-296025 A | 10/1994 |
| JP | 9-259591 A | 10/1997 |
| JP | 10-209407 A | 8/1998 |
| JP | 2003-86714 A | 3/2003 |
| JP | 2005-12137 A | 1/2005 |
| JP | 2005-268418 A | 9/2005 |

OTHER PUBLICATIONS

Tanzawa et al., "Design of a Sense Circuit for Low-Voltage Flash Memories", IEEE J. Solid-State Circuits, vol. 35, No. 10, pp. 1415-1421, Oct. 2000.

Endoh et al., "A Study of High-Performance NAND Structured EEPROMS", IEICE Transactions on Electron, vol. E75-C, No. 11, pp. 1351-1357, Nov. 1992.

Extended European Search Report for European Application No. 07790682.4, dated Jan. 27, 2011, 6 pages.

* cited by examiner

Y'₁ ——————————————————————— Y₁

100

Y'₂ ——————————————————————— Y₂

100

X ——————————————————————— X'

X ——————————————————————— X'

NONVOLATILE SEMICONDUCTOR MEMORY AND METHOD FOR DRIVING THE SAME

RELATED APPLICATIONS

This application is a continuation of PCT/JP2007/063888, filed on Jul. 12, 2007, which claims priority to Japanese Application No. JP2006-191469, filed on Jul. 12, 2006. The entire contents of these applications are incorporated herein by reference.

TECHNICAL FIELD

The present invention relates to a nonvolatile semiconductor memory and a method for driving it.

BACKGROUND ART

In a memory cell of a NOR-type flash memory having a control gate and a charge accumulation layer, the one having a MOS transistor structure in which electric charge is injected into the charge accumulation layer through the use of a hot electron has been publicly known (see, for example, T. Tanzawa, Y. Takano, T. Taura, and S. Atsumi, IEEE J. Solid-State Circuits, Vol. 35, no. 10, p. 1415-1421, 2000). Variations in threshold voltage resulting from variations in the charge accumulation state of the charge accumulation layer are stored as data "0", "1". For example, in the case of an N-channel memory cell using a floating gate in the charge accumulation layer, in order to inject electric charge into the floating gate, high voltage is applied to a control gate and a drain diffusion layer and a source diffusion layer and a semiconductor substrate are grounded. At this point, the source-drain voltage raises the energy of electrons in the semiconductor substrate, making them overcome the energy barrier of a tunnel oxide film and injecting them into the charge accumulation layer. As a result of this charge injection, the threshold voltage of the memory cell shifts in a positive direction. The ratio of the current injected into the charge accumulation layer to the current flowing between the source-drain is small. As a result, the current required for writing is of the order of 100 µA per cell, making it unsuitable for enhancing the speed of writing.

FIGS. 1 and 2 are an equivalent circuit and a layout, respectively, of a memory cell array of the conventional NOR-type flash memory described in the aforementioned Literature. The memory cells are arranged in a matrix. Bit lines (BL1, BL2, . . . ) are laid out in a column direction (a vertical direction in FIGS. 1 and 2), control gate lines (WL1, W12, . . . ) are laid out in a row direction (a horizontal direction in FIGS. 1 and 2), a source line is laid out in the row direction, and the source line (SL) is connected to all the source diffusion layers of the memory cells connected to the control gate lines.

With the recent development of semiconductor technology, in particular, with the development of microfabrication technology, a memory cell of a flash memory has been becoming rapidly miniaturized, and the capacities thereof has been becoming rapidly high. In the NOR-type flash memory, due to the above-described writing method it adopts, the short channel effect causes an increase in a leakage current, making it impossible to read and write data normally, and it has become difficult to reduce the gate length of the memory cell.

On the other hand, in a memory cell of a NAND-type flash memory having a control gate and a charge accumulation layer, the one having a MOS transistor structure in which electric charge is injected into the charge accumulation layer through the use of an FN (Fowler-Nordheim) tunnel current has been publicly known (see, for example, JP-H1-173652A). In the case of an N-channel memory cell using a floating gate in the charge accumulation layer, in order to inject electric charge into the floating gate, a voltage perpendicular to the memory cell is applied to a control gate, whereby electrons can be injected into the floating gate. At this point, the source-drain of the memory cell with the floating gate into which electrons are injected are grounded. On the other hand, to the source-drain of the memory cell with the floating gate into which no electron is injected, the same positive voltage is applied, whereby writing into the memory cell is blocked. In this NAND-type flash memory, there is no need to apply voltage between the source-drain of the memory cell. As a result, as compared with the flash memory injecting the electric charge into the charge accumulation layer through the use of the hot electron, the flash memory injecting the electric charge into the charge accumulation layer through the use of the FN tunnel current achieves a reduction in the gate length of the memory cell more easily. Furthermore, the flash memory injecting the electric charge into the charge accumulation layer by using the FN tunnel current can perform writing and erasing in both directions on the entire channel surface, making it possible to concurrently realize high-speed writing and high reliability (see, for example, T. Endoh, R. Shirota, S. Aritome, and F. Masuoka, IEICE Transactions on Electron, Vol. E75-C, no. 11, pp. 1351-1357, November 1992).

Therefore, in the NOR-type flash memory, it is necessary to inject the electric charge into the charge accumulation layer through the use of the FN tunnel current.

However, it is difficult to perform, for a selected one memory cell, injection of electric charge into the charge accumulation layer through the use of the FN tunnel current by using the equivalent circuit of the conventional NOR-type flash memory shown in FIG. 1. When high voltage is applied to a control gate line, all the memory cells connected to the control gate line are brought into conduction, and, since the source line is connected to all the memory cells connected to the control gate line, all the bit lines are short-circuited. It is for this reason that, by using a conventional planar memory cell, source lines connected to the sources of the memory cells are laid out in the column direction. An equivalent circuit and a layout of the memory cell array of the NOR-type flash memory thus obtained are shown in FIGS. 3 and 4, respectively. As shown in FIG. 4, as a result of the source lines and the bit lines being laid out in the same wiring layer, the area of the memory cell becomes twice or more than that of the case where the hot electron is used.

SUMMARY OF THE INVENTION

Therefore, an object of the present invention is to provide a NOR-type nonvolatile semiconductor memory that can inject electric charge into a charge accumulation layer through the use of an FN tunnel current without compromising large scale integration of memory cells.

A nonvolatile semiconductor memory of the present invention is a nonvolatile semiconductor memory in which memory cells each having a source region, a channel region, and a drain region formed in this order from the side of a substrate and further including a charge accumulation layer formed, via a gate insulation film, on the outside of the channel region and a control gate formed, via an insulation layer, on the outside of the charge accumulation layer so as to cover the charge accumulation layer are arranged on the substrate in a matrix with n rows and m columns, the nonvolatile semiconductor memory including:

a plurality of source lines laid out in a column direction so as to connect the source regions of the memory cells with each other, the memory cells being aligned in the column direction of the matrix;

a plurality of parallel bit lines laid out in the column direction in a layer different from the source lines so as to connect the drain regions of the memory cells with each other, the memory cells being aligned in the column direction;

a plurality of gate lines laid out in a row direction so as to connect the control gates of the memory cells with each other, the memory cells being aligned in the row direction that is substantially perpendicular to the column direction;

a plurality of transistors provided in such a way that one row of transistors is formed at intervals of p (p<n) rows of the matrix, the transistors each having a source region, a channel region, and a drain region formed in this order from a substrate side, each source region being connected to the source line of a column to which the source region belongs;

read lines laid out in the row direction so as to connect gates of the transistors with each other, the transistors being aligned in the same row; and common source lines connecting the drain regions of the transistors with each other, the transistors being aligned in the same row.

In addition, the nonvolatile memory of the present invention is configured so as to include the source region, the channel region, and the drain region of the each transistor formed concurrently with the source region, the channel region, and the drain region, respectively, of the each memory cell.

A method of the present invention is a method for writing into the nonvolatile semiconductor memory, which is a first invention, by which, by applying 0 V or a positive first voltage to a selected bit line and a selected source line, applying the positive first voltage to a non-selected bit line and a non-selected source line, applying a positive second voltage to a selected gate line, applying 0 V to a non-selected gate line, applying 0 V to the read lines, and applying a positive third voltage which is half the positive first voltage to the common source lines, electric charge is injected into the charge accumulation layer of a selected memory cell through the use of an FN tunnel current.

Moreover, a method of the present invention is a method for reading the nonvolatile semiconductor memory, which is the first invention, the method for reading the nonvolatile semiconductor memory by which, by applying a positive first voltage to a selected gate line, applying 0 V to a non-selected gate line, applying 0 V to the source lines, applying a positive second voltage to a selected bit line, applying 0 V to a non-selected bit line and a common source line, and applying a positive third voltage to the read lines, data is read from a selected memory cell.

In addition, a method of the present invention is a method for erasing the nonvolatile semiconductor memory, which is the first invention, the method for erasing the nonvolatile semiconductor memory by which, by applying a positive first voltage to all the bit lines and all the source lines, applying 0 V to all gate lines, and applying the positive first voltage to all the common source lines and the read lines, data of all the memory cells is erased at a time.

Moreover, a method of the present invention is a method for erasing the described nonvolatile semiconductor memory, which is the first invention, the method for erasing the nonvolatile semiconductor memory by which, by applying a positive first voltage to all the bit lines and the source lines, applying 0 V to a selected control gate line, applying a positive second voltage to a non-selected gate line, and applying the positive first voltage to all the common source lines and the read lines, data of the memory cells connected to the selected gate line is erased at a time.

In addition, a method of the present invention is a method for erasing the nonvolatile semiconductor memory, which is the first invention, the method for erasing the nonvolatile semiconductor memory by which, by applying a positive first voltage to a selected bit line and a selected source line, applying a positive second voltage to a non-selected bit line and a non-selected source line, applying 0 V to all gate lines, applying the positive second voltage to all the read lines, and applying a positive third voltage which is half the sum of the positive first voltage and the positive second voltage to all the common source lines, data of the memory cells connected to the selected bit line is erased at a time.

Moreover, a method of the present invention is a method for erasing the nonvolatile semiconductor memory, which is the first invention, the method for erasing the nonvolatile semiconductor memory by which, by applying a positive first voltage to a selected bit line and a selected source line, applying a positive second voltage to a non-selected bit line and a non-selected source line, applying 0 V to a selected gate line, applying the positive second voltage to a non-selected gate line, applying the positive second voltage to the read lines, and applying a positive third voltage which is half the sum of the positive first voltage and the positive second voltage to the common source lines, data of a selected memory cell is erased.

According to this invention, a bit line and a source line can be disposed in such a way that they are laid one on top of another when a nonvolatile semiconductor memory cell is viewed from above, making it possible to form them so as to become parallel to each other without increasing the area of the memory cell. When high voltage is applied to a gate line, all the memory cells connected to the gate line are brought into conduction. As a result of the source line being formed so as to be parallel to the bit line, it is possible to apply the same voltage to the bit line and the source line. That is, it is possible to perform, for a selected one memory cell, injection of electric charge into the charge accumulation layer through the use of the FN tunnel current. Since the source line is formed as a diffusion layer, the resistance thereof becomes high. Therefore, by disposing one transistor at intervals of a predetermined number of (for example, 64) memory cells connected to the bit line and the source line, and connecting the source line to the common source line via the transistor, it is possible to lower the resistance of the source diffusion layer and therefore achieve high-speed reading.

DETAILED DESCRIPTION OF THE PREFERRED EMBODIMENTS

Figure 1:
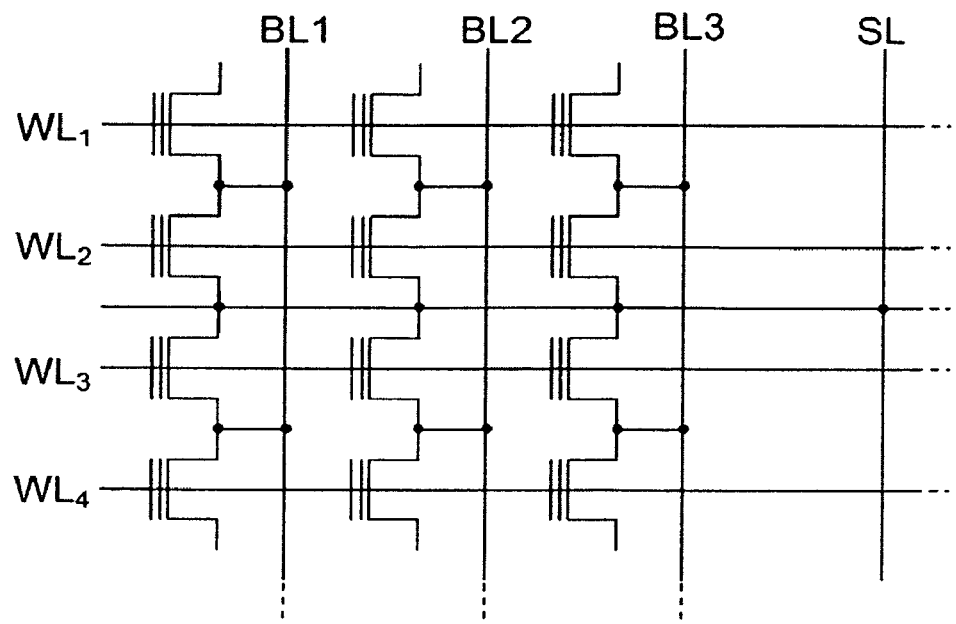
FIG. 1 is an equivalent circuit of a memory cell array of a conventional NOR-type flash memory.
Figure 2:
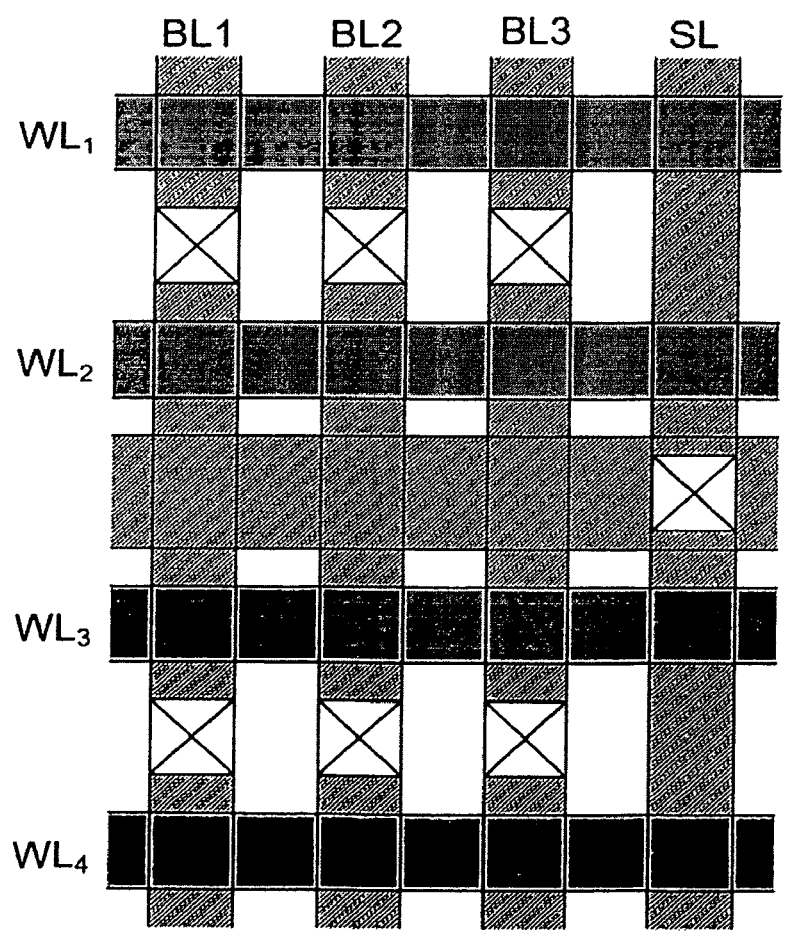
FIG. 2 is a layout of the memory cell array of the conventional NOR-type flash memory.
Figure 3:
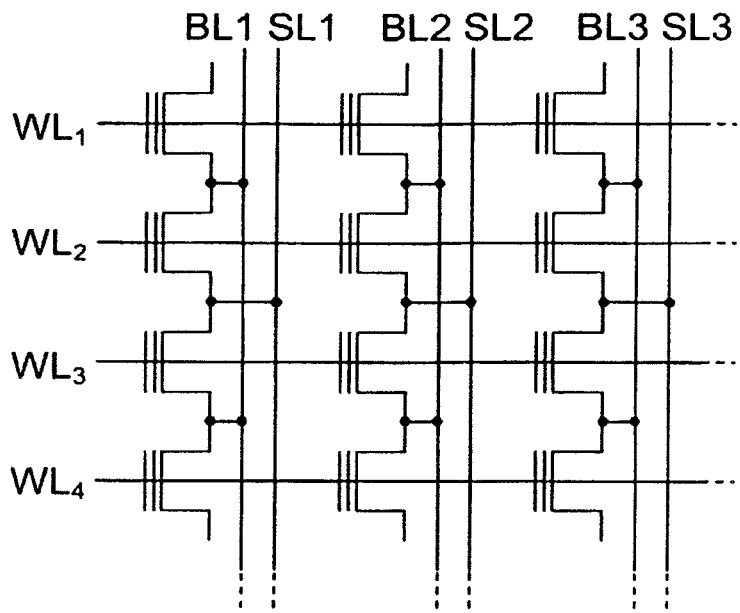
FIG. 3 is an equivalent circuit of a memory cell array of a NOR-type flash memory in which, by using a conventional planar memory cell, source lines connected to the sources of the memory cells are formed in parallel with bit lines.
Figure 4:
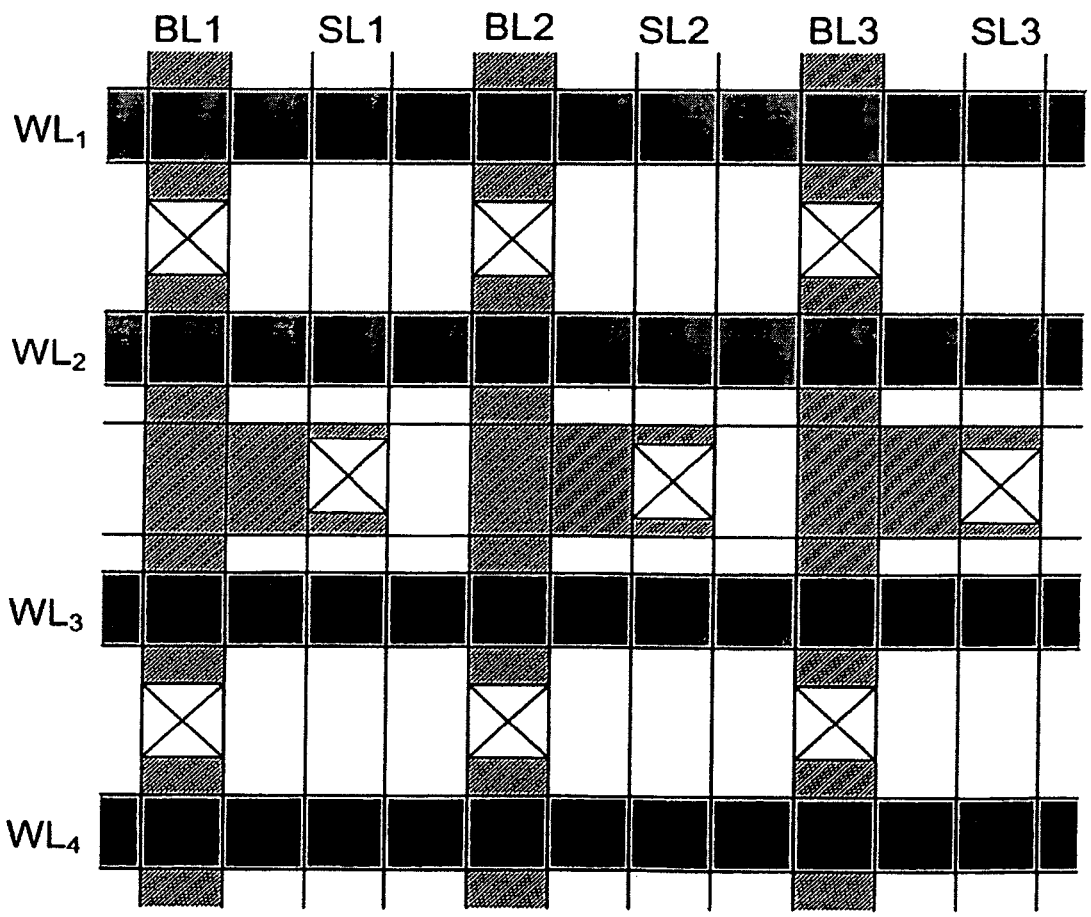
FIG. 4 is a layout of a memory cell array of a NOR-type flash memory in which, by using a conventional planar memory cell, source lines connected to the sources of the memory cells are formed in parallel with bit lines.
Figure 5:
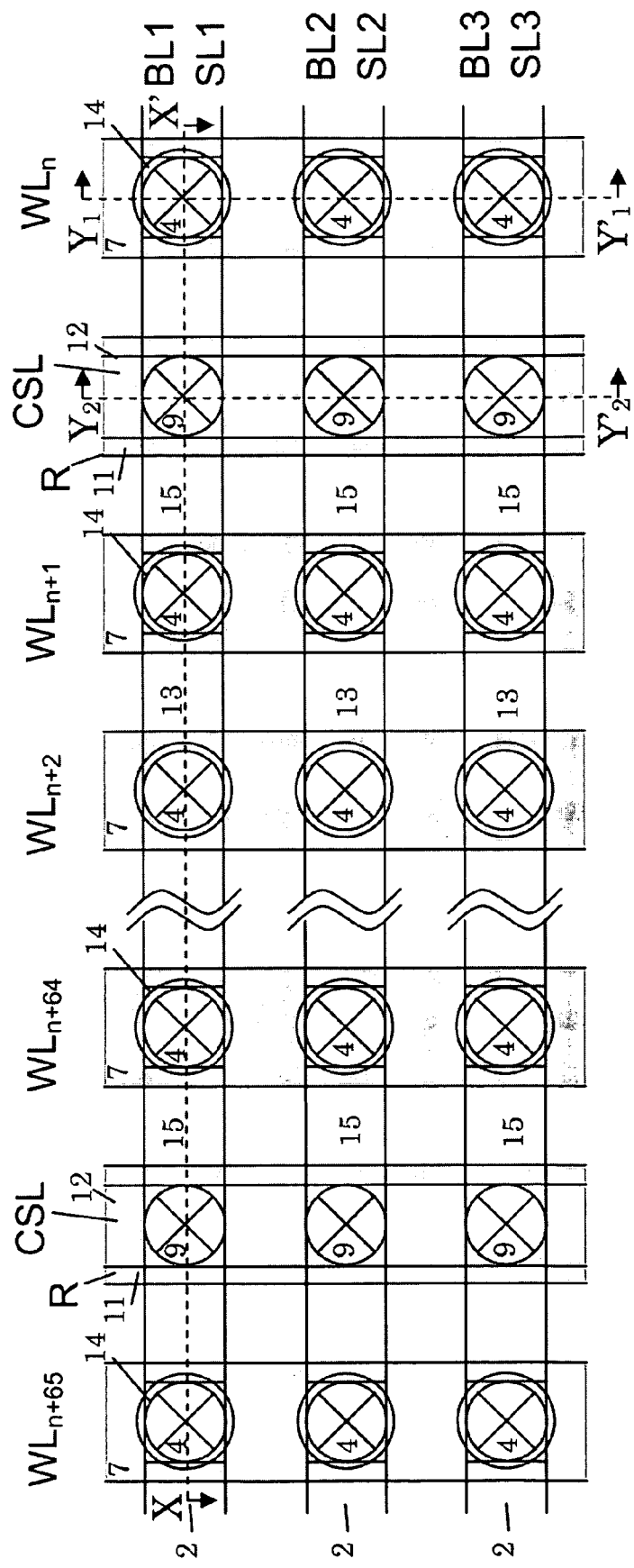
FIG. 5 is a layout of a nonvolatile semiconductor memory according to the invention.
Figure 6:
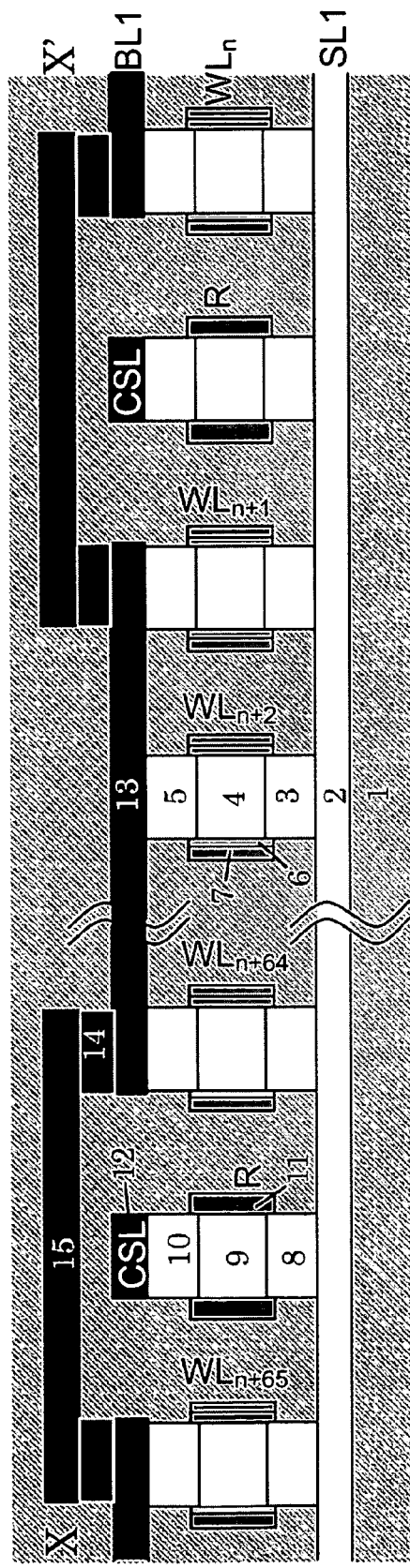
FIG. 6 is a sectional structure of the nonvolatile semiconductor memory according to the invention.
Figure 7:
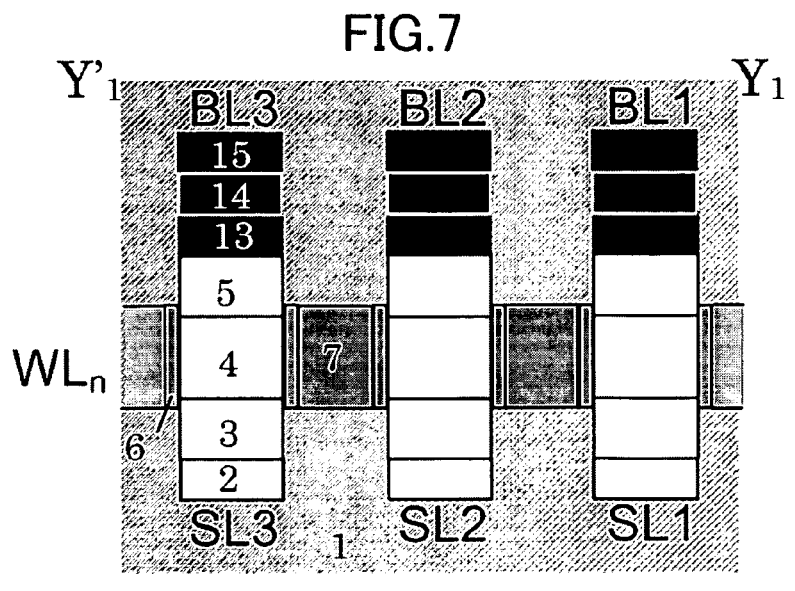
FIG. 7 is a sectional structure of the nonvolatile semiconductor memory according to the invention.
Figure 8:
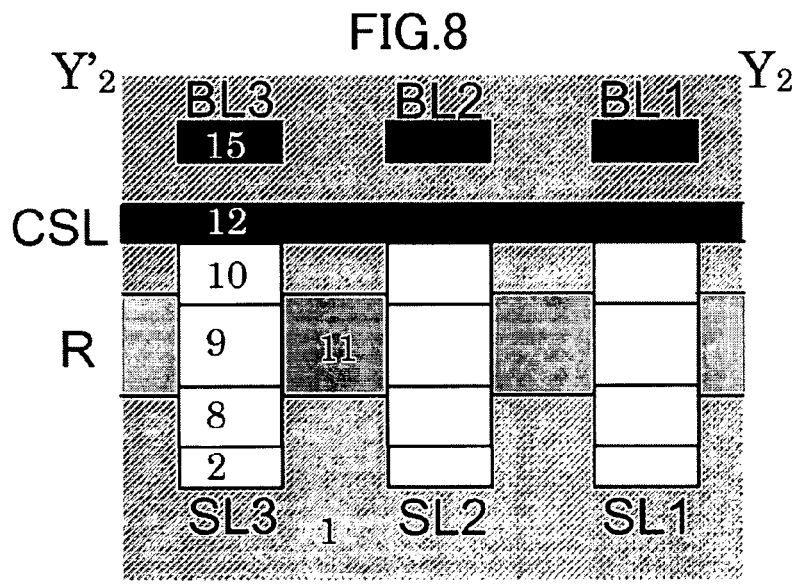
FIG. 8 is a sectional structure of the nonvolatile semiconductor memory according to the invention.

A nonvolatile semiconductor memory according to the invention includes a large number of island semiconductor layers formed on a semiconductor substrate. The island semiconductor layer is composed of a drain diffusion layer formed in the upper part thereof, a source diffusion layer formed in the lower part thereof, a charge accumulation layer formed on a channel region of the side wall sandwiched between the drain diffusion layer and the source diffusion layer via a gate insulation film, and a nonvolatile semiconductor memory cell having a control gate formed on the charge accumulation layer. On the whole, it has a structure in which the nonvolatile semiconductor memory cells are arranged in a matrix, bit lines connected to the drain diffusing layer are laid out in a column direction, gate lines are laid out in a row direction, and source lines connected to the source diffusion layer are laid out in the column direction.

In addition, in the nonvolatile semiconductor memory of the invention, one transistor is disposed at intervals of a predetermined number of (for example, 64) memory cells connected to the bit line and the source line, a read line connected to the gate of the transistor is laid out in the row direction, the source line is connected to the source of the transistor, and a common source line connected to the drain of the transistor is laid out in the row direction. Therefore, when this nonvolatile semiconductor memory is considered to be a matrix with n rows and m columns, one row of the transistors is formed at intervals of 64 rows, for example, and the source regions thereof are connected to the source lines of the columns to which they belong. Furthermore, the gates of the transistors aligned in the same row of transistors are connected with each other by the read line, and the drain regions of the transistors aligned in the same row are connected with each other by the common source line.

A driving method of the invention makes it possible, by applying 0 V or a positive first voltage to a selected bit line and a selected source line, applying the positive first voltage to a non-selected bit line and a non-selected source line, applying a positive second voltage to a selected gate line, and applying 0 V to a non-selected gate line, to perform, on a selected memory cell, injection of electric charge into the charge accumulation layer through the use of the FN tunnel current. At this point, by applying 0 V to the read lines, the common source lines and the source lines are electrically isolated from each other. In addition, by applying a voltage which is half the positive first voltage to the common source lines, it is possible to make the withstand voltage between the source-drain of the transistors connecting the common source lines and the source lines equal to half the positive first voltage.

A driving method of the invention makes it possible, by applying a positive first voltage to a selected gate line, applying 0 V to a non-selected gate line, applying 0 V to the source lines, and applying a positive second voltage to a selected bit line, to read a selected memory cell. At this point, by applying 0 V to a non-selected bit line and a common source line and applying a positive third voltage to the read lines, the source lines are connected to the common source lines via the transistors disposed at intervals of more than one memory cell connected to the bit line and the source line, whereby it is possible to lower the resistance of the source diffusion layer and therefore achieve high-speed reading.

A driving method of the invention makes it possible, by applying a positive first voltage to the bit lines and the source lines, applying 0 V to the gate lines, and applying the positive first voltage to the common source lines and the read lines, to release the electric charge from the charge accumulation layers of all the memory cells through the use of the FN tunnel current.

A driving method of the invention makes it possible, by applying a positive first voltage to the bit lines and the source lines, applying 0 V to a selected gate line, applying a positive second voltage to a non-selected gate line, and applying the positive first voltage to the common source lines and the read lines, to release the electric charge from the charge accumulation layers of the memory cells connected to the selected gate line through the use of the FN tunnel current.

A driving method of the invention makes it possible, by applying a positive first voltage to a selected bit line and a selected source line, applying a positive second voltage to a non-selected bit line and a non-selected source line, applying 0 V to the gate lines, applying the positive second voltage to the read lines, and applying a positive third voltage which is half the sum of the positive first voltage and the positive second voltage to the common source lines, to release the electric charge from the charge accumulation layers of the memory cells connected to the selected bit line through the use of the FN tunnel current.

A driving method of the invention makes it possible, by applying a positive first voltage to a selected bit line and a selected source line, applying a positive second voltage to a non-selected bit line and a non-selected source line, applying 0 V to a selected gate line, applying a positive third voltage to a non-selected gate line, applying the positive third voltage to the read lines, and applying the positive third voltage which is half the sum of the positive first voltage and the positive second voltage to the common source lines, to release the electric charge from the charge accumulation layer of a selected memory cell through the use of the FN tunnel current.

EXAMPLES

Hereinafter, based on an embodiment shown in the drawings, the invention will be described. It is to be understood that the invention is not limited in any way by this embodiment.

A layout and a sectional structure of a nonvolatile semiconductor memory according to the invention are shown in FIGS. 5, 6, 7, and 8. In this example, on a silicon oxide film 1, source lines 2 and source diffusion layers 3 are formed, island semiconductor layers 4 are formed thereon, drain diffusion layers 5 are formed in the upper parts of the island semiconductor layers 4, charge accumulation layers 6 formed on the channel regions of the side walls sandwiched between the drain diffusion layers 5 and the source diffusion layers 3 via gate insulation films are formed, and control gates are formed on the charge accumulation layers 6, whereby memory cells are formed. Lines which are laid out in rows so as to connect control gates of memory cells with each other are gate lines 7. In addition, at intervals of a predetermined number of (here, at intervals of 64) memory cells, on the source lines 2 and source diffusion layers 8, island semiconductor layers 9 are formed, on the island semiconductor layers, drain diffusion layers 10 are formed, read lines 11 formed on the channel regions of the side walls sandwiched between the drain diffusion layers 10 and the source diffusion layers 8 via gate insulation films are formed, on the drain diffusion layers 10, common source lines 12 are formed, whereby transistors are formed, and the source lines 2 and the common source lines 12 are connected to each other. In place of the transistors disposed at intervals of more than one memory cell, memory cells may be used. Furthermore, on the drain diffusion layers 5, bit lines 13 are formed, on the bit lines 13, vias 14 are formed, and, on the vias 14, bit lines 15 are formed.

Figure 9:
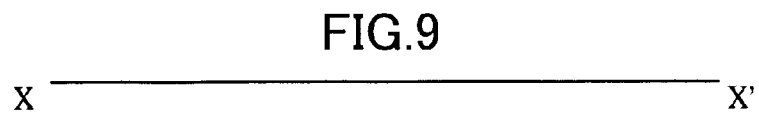
FIG. 9 is an X-X' sectional process diagram for explaining an example of fabrication of a memory cell array according to the invention.
Figure 10:
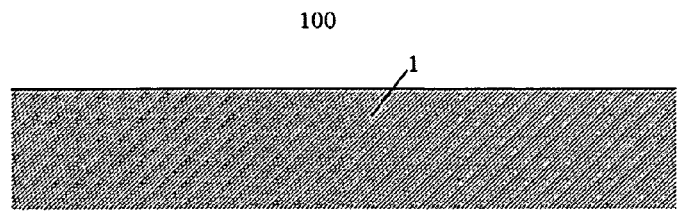
FIG. 10 is a $Y_1$-$Y_1$' sectional process diagram for explaining the example of fabrication of the memory cell array according to the invention.
Figure 11:
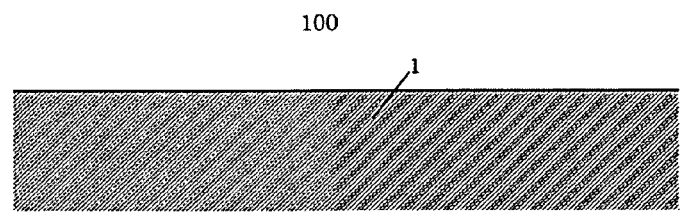
FIG. 11 is a $Y_2$-$Y_2$' sectional process diagram for explaining the example of fabrication of the memory cell array according to the invention.

Hereinafter, an example of a fabrication process for forming the structure of a memory cell array provided in the nonvolatile semiconductor memory according to the invention will be explained with reference to FIGS. 9 to 59. FIG. 9 is an X-X' sectional view of an SOI substrate in which P-type silicon 100 is formed on the silicon oxide film 1. In addition, FIG. 10 is a $Y_1$-$Y_1$' sectional view, and FIG. 10 is a $Y_2$-$Y_2$' sectional view. The X-X' section is a section corresponding to FIG. 6, the $Y_1$-$Y_1$' section is a section corresponding to FIG. 7, and the $Y_2$-$Y_2$' section is a section corresponding to FIG. 8.

Figure 12:
FIG. 12 is an X-X' sectional process diagram for explaining the example of fabrication of the memory cell array according to the invention.
Figure 13:
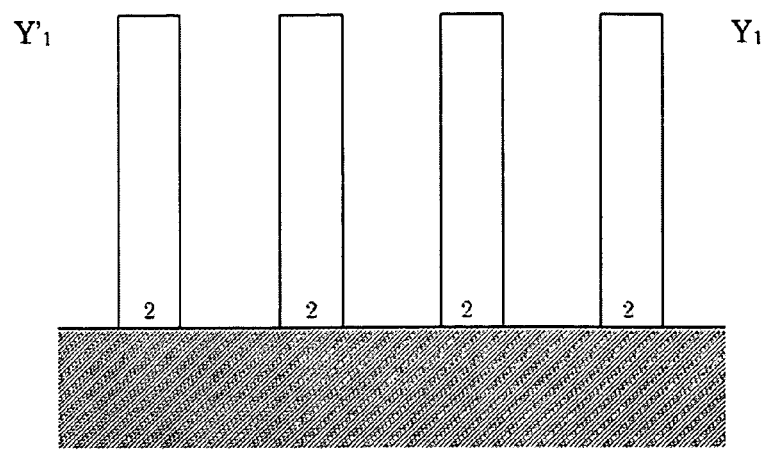
FIG. 13 is a $Y_1$-$Y_1$' sectional process diagram for explaining the example of fabrication of the memory cell array according to the invention.
Figure 14:
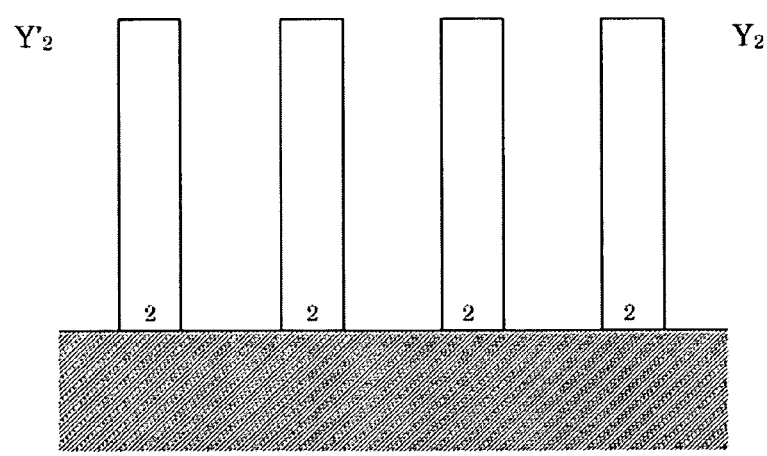
FIG. 14 is a $Y_2$-$Y_2$' sectional process diagram for explaining the example of fabrication of the memory cell array according to the invention.

By using a resist as a mask, the P-type silicon 100 is etched by reactive ion etching, thereby forming the source lines 2 (FIG. 12 (X-X'), FIG. 13 ($Y_1$-$Y_1$'), and FIG. 14 ($Y_2$-$Y_2$')).

Figure 15:
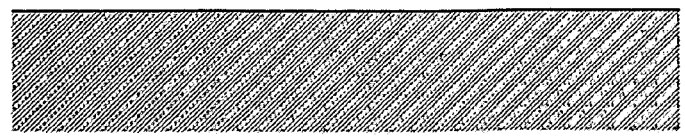
FIG. 15 is an X-X' sectional process diagram for explaining the example of fabrication of the memory cell array according to the invention.
Figure 16:
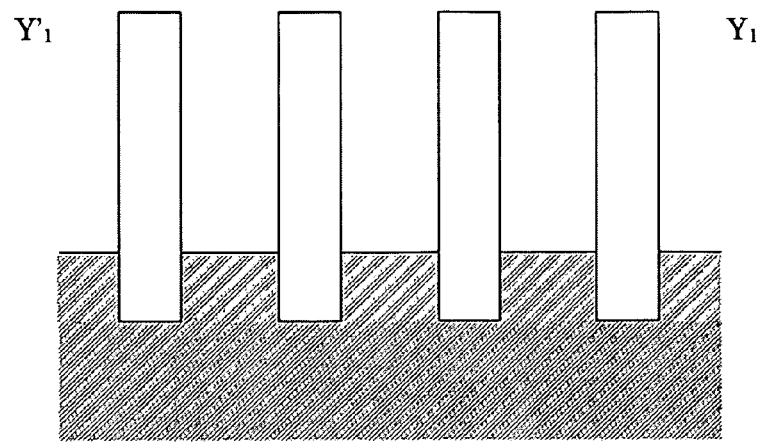
FIG. 16 is a $Y_1$-$Y_1$' sectional process diagram for explaining the example of fabrication of the memory cell array according to the invention.
Figure 17:
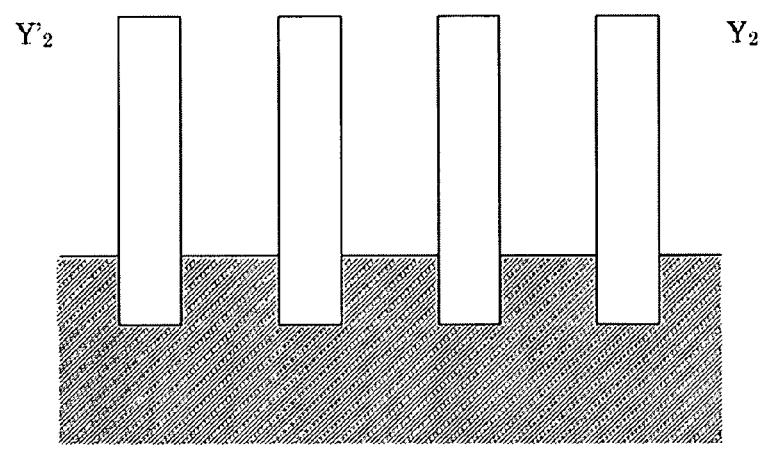
FIG. 17 is a $Y_2$-$Y_2$' sectional process diagram for explaining the example of fabrication of the memory cell array according to the invention.

An oxide film is deposited, planarization is performed by CMP, and etch-back is performed by using reactive ion etching (FIG. 15 (X-X'), FIG. 16 ($Y_1$-$Y_1$'), and FIG. 17 ($Y_2$-$Y_2$')).

Figure 18:
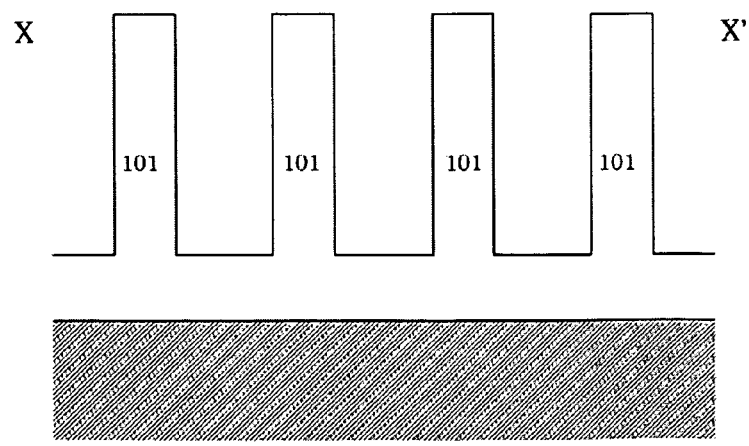
FIG. 18 is an X-X' sectional process diagram for explaining the example of fabrication of the memory cell array according to the invention.
Figure 19:
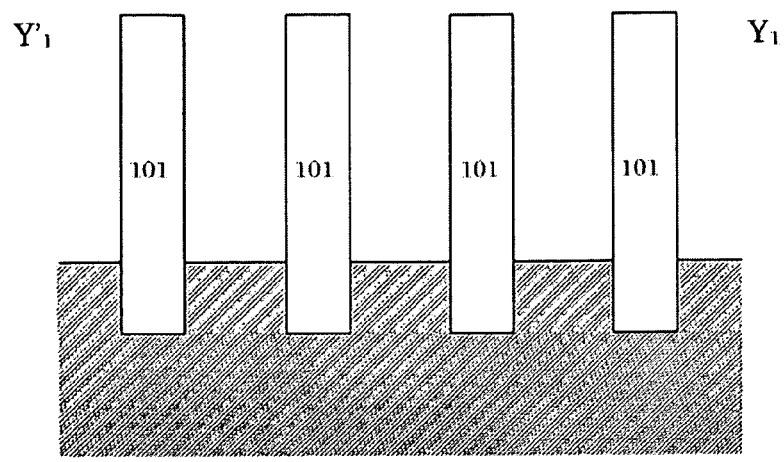
FIG. 19 is a $Y_1$-$Y_1$' sectional process diagram for explaining the example of fabrication of the memory cell array according to the invention.
Figure 20:
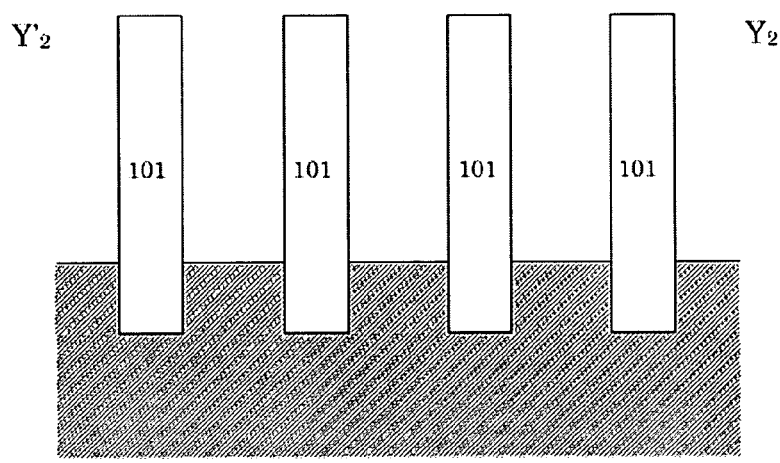
FIG. 20 is a $Y_2$-$Y_2$' sectional process diagram for explaining the example of fabrication of the memory cell array according to the invention.

By using a resist as a mask, the P-type silicon is etched by reactive ion etching, thereby forming island semiconductor layers 101 (FIG. 18 (X-X'), FIG. 19 ($Y_1$-$Y_1$'), and FIG. 20 ($Y_2$-$Y_2$')). The lower parts of the island semiconductor layers 101 serve as the source lines 2.

Figure 21:
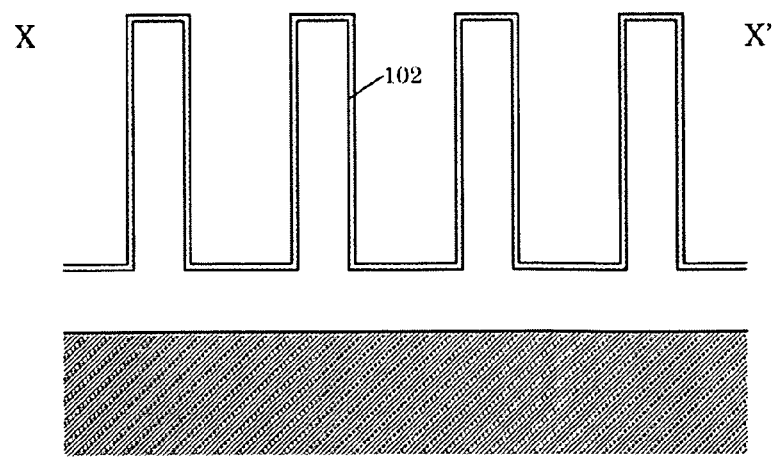
FIG. 21 is an X-X' sectional process diagram for explaining the example of fabrication of the memory cell array according to the invention.
Figure 22:
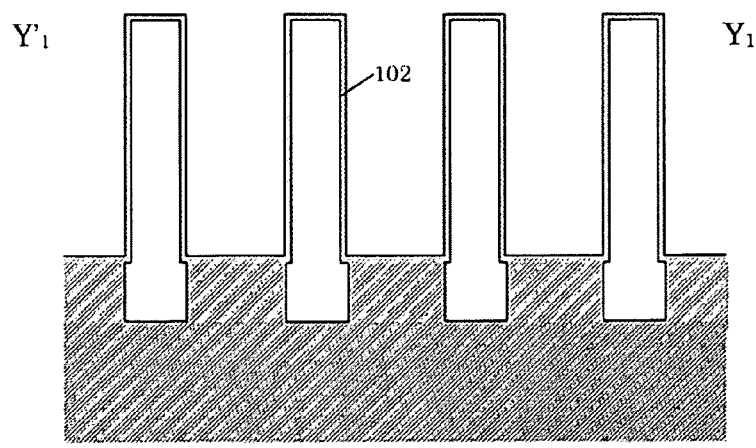
FIG. 22 is a $Y_1$-$Y_1$' sectional process diagram for explaining the example of fabrication of the memory cell array according to the invention.
Figure 23:
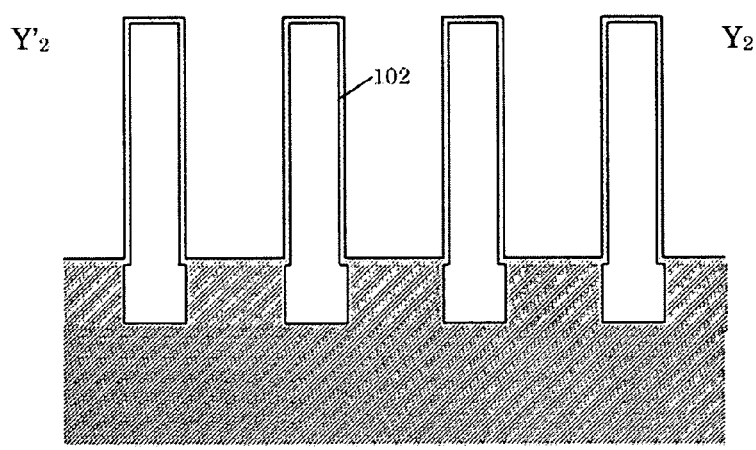
FIG. 23 is a $Y_2$-$Y_2$' sectional process diagram for explaining the example of fabrication of the memory cell array according to the invention.

Then, oxidization is performed, whereby a tunnel insulation film 102 is formed (FIG. 21 (X-X'), FIG. 22 ($Y_1$-$Y_1$'), and FIG. 23 ($Y_2$-$Y_2$')).

Figure 24:
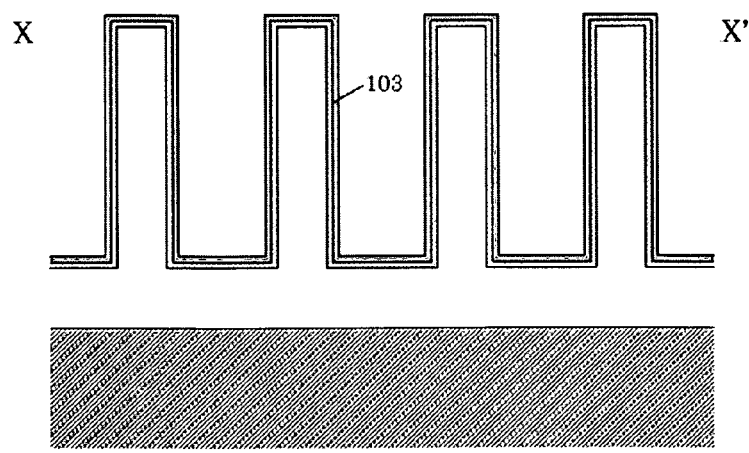
FIG. 24 is an X-X' sectional process diagram for explaining the example of fabrication of the memory cell array according to the invention.
Figure 25:
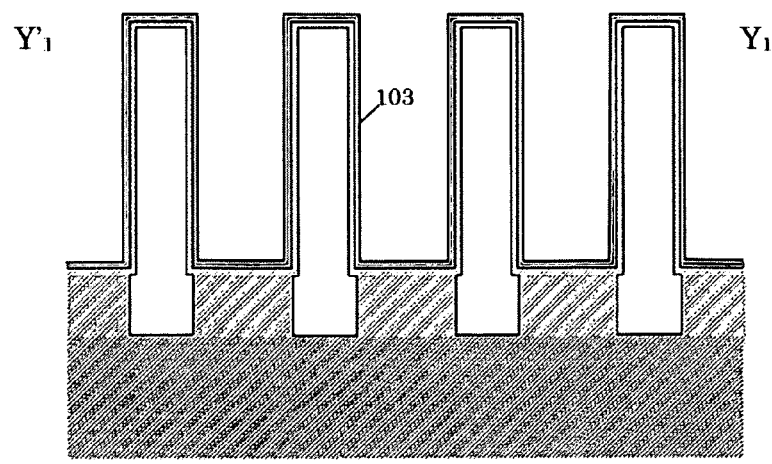
FIG. 25 is a $Y_1$-$Y_1$' sectional process diagram for explaining the example of fabrication of the memory cell array according to the invention.
Figure 26:
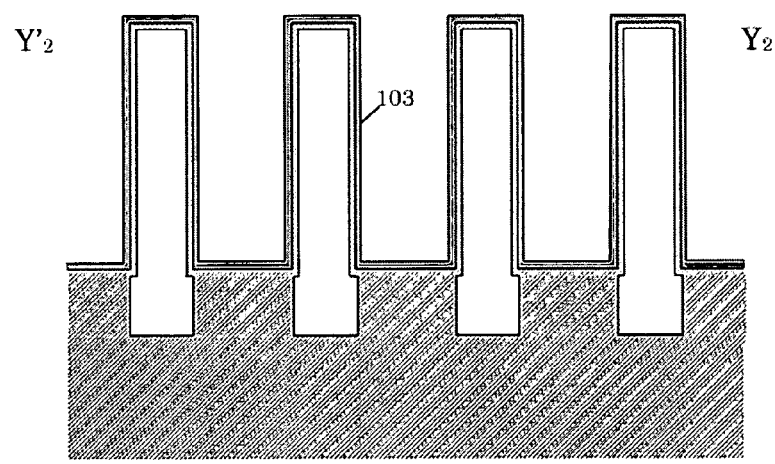
FIG. 26 is a $Y_2$-$Y_2$' sectional process diagram for explaining the example of fabrication of the memory cell array according to the invention.

Then, a polysilicon film 103 is deposited (FIG. 24 (X-X'), FIG. 25 ($Y_1$-$Y_1$'), and FIG. 26 ($Y_2$-$Y_2$')).

Figure 27:
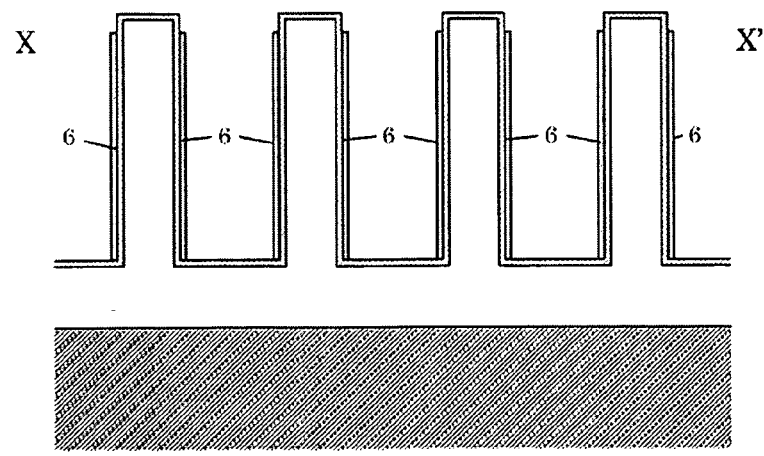
FIG. 27 is an X-X' sectional process diagram for explaining the example of fabrication of the memory cell array according to the invention.
Figure 28:
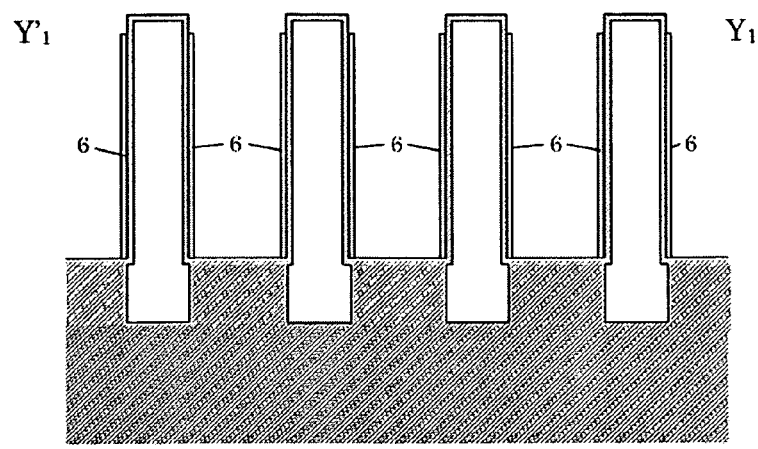
FIG. 28 is a $Y_1$-$Y_1$' sectional process diagram for explaining the example of fabrication of the memory cell array according to the invention.
Figure 29:
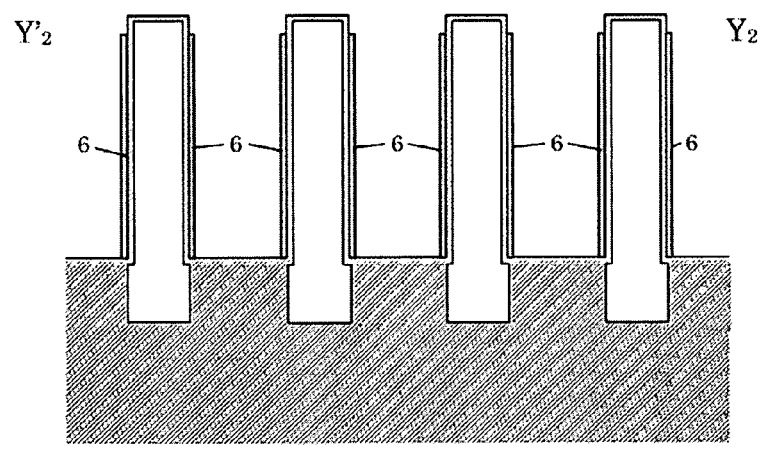
FIG. 29 is a $Y_2$-$Y_2$' sectional process diagram for explaining the example of fabrication of the memory cell array according to the invention.

Then, the polysilicon film is etched by reactive ion etching so as to be left on the side walls of the island semiconductor layers in the form of a side wall spacer, thereby forming the charge accumulation layers 6 (FIG. 27 (X-X'), FIG. 28 ($Y_1$-$Y_1$'), and FIG. 29 ($Y_2$-$Y_2$')).

Figure 30:
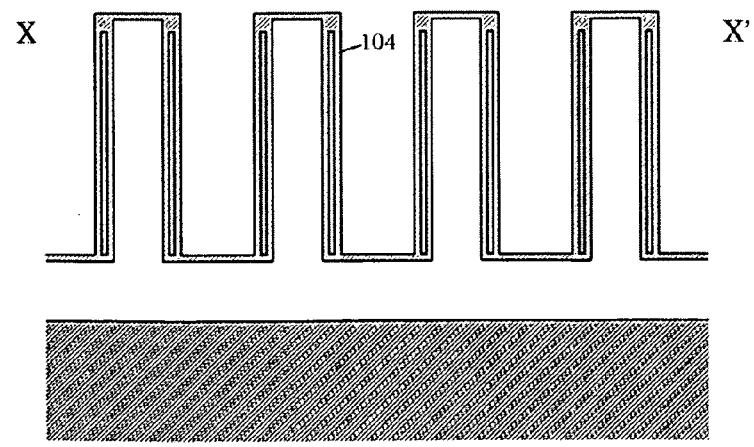
FIG. 30 is an X-X' sectional process diagram for explaining the example of fabrication of the memory cell array according to the invention.
Figure 31:
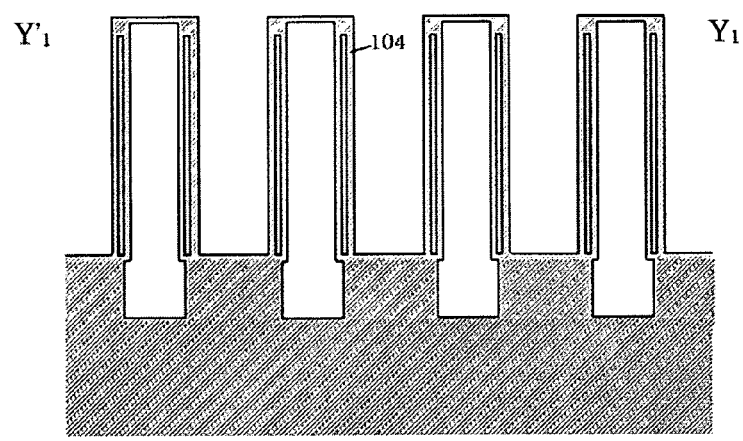
FIG. 31 is a $Y_1$-$Y_1$' sectional process diagram for explaining the example of fabrication of the memory cell array according to the invention.
Figure 32:
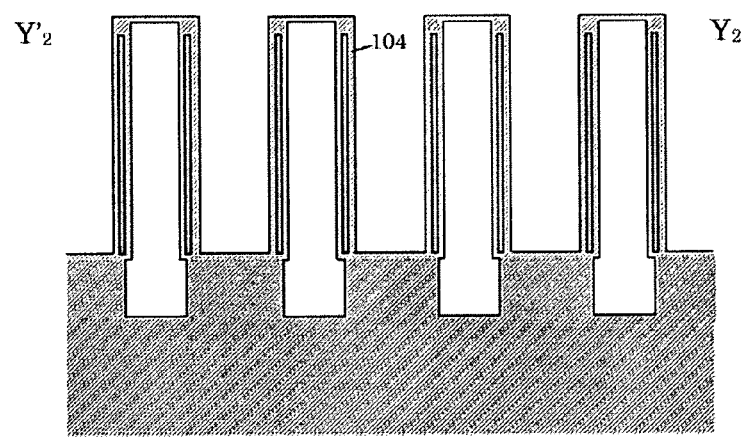
FIG. 32 is a $Y_2$-$Y_2$' sectional process diagram for explaining the example of fabrication of the memory cell array according to the invention.

Then, oxidization is performed, whereby an inter-poly insulation film 104 is formed (FIG. 30 (X-X'), FIG. 31 ($Y_1$-$Y_1$'), and FIG. 32 ($Y_2$-$Y_2$')). It is also possible to deposit an insulation film by CVD.

Figure 33:
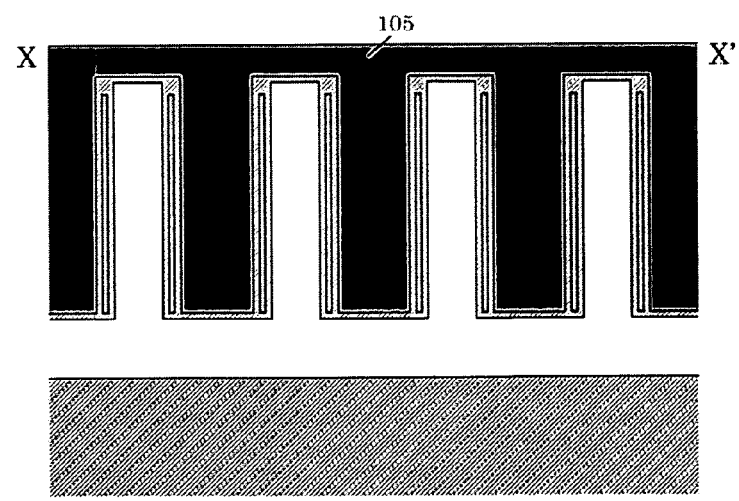
FIG. 33 is an X-X' sectional process diagram for explaining the example of fabrication of the memory cell array according to the invention.
Figure 34:
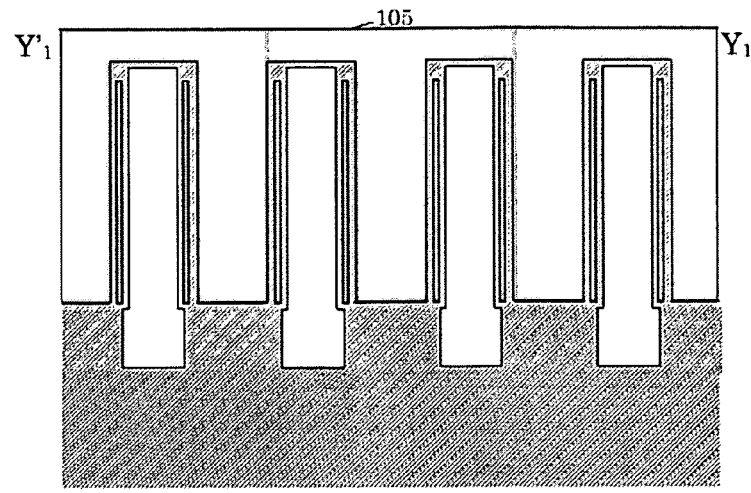
FIG. 34 is a $Y_1$-$Y_1$' sectional process diagram for explaining the example of fabrication of the memory cell array according to the invention.
Figure 35:
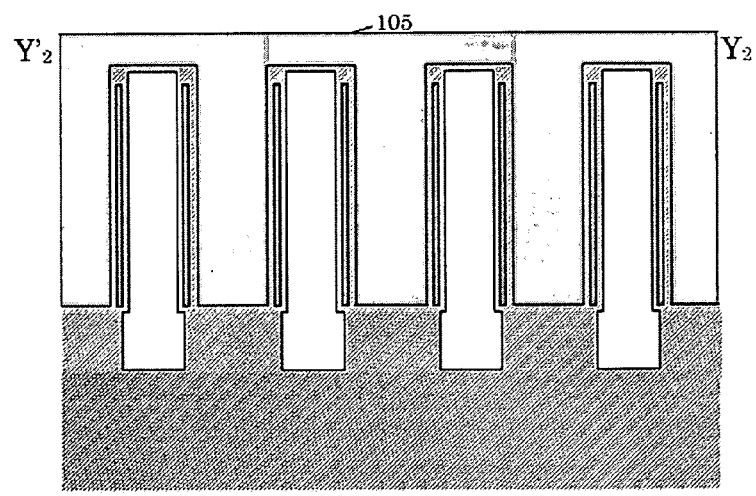
FIG. 35 is a $Y_2$-$Y_2$' sectional process diagram for explaining the example of fabrication of the memory cell array according to the invention.

Then, a polysilicon film 105 is deposited (FIG. 33 (X-X'), FIG. 34 ($Y_1$-$Y_1$'), and FIG. 35 ($Y_2$-$Y_2$')).

Figure 36:
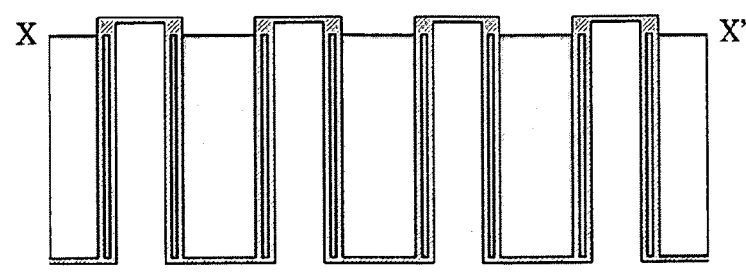
FIG. 36 is an X-X' sectional process diagram for explaining the example of fabrication of the memory cell array according to the invention.
Figure 36:
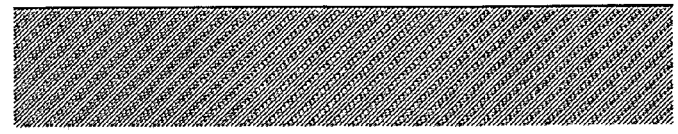
Figure 37:
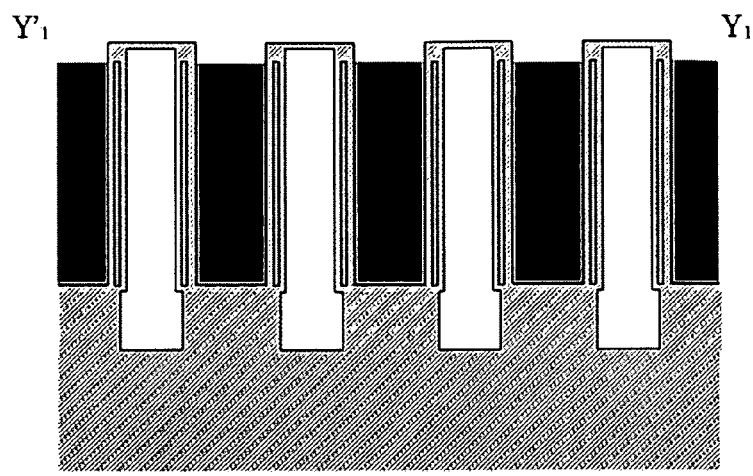
FIG. 37 is a $Y_1$-$Y_1$' sectional process diagram for explaining the example of fabrication of the memory cell array according to the invention.
Figure 38:
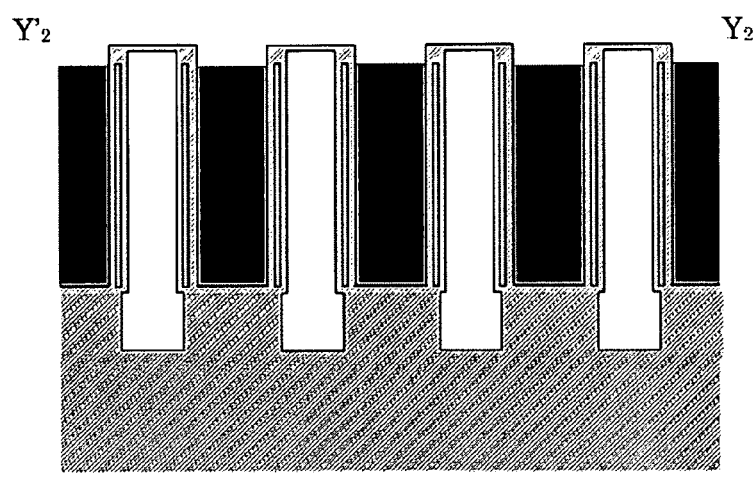
FIG. 38 is a $Y_2$-$Y_2$' sectional process diagram for explaining the example of fabrication of the memory cell array according to the invention.
Figure 39:
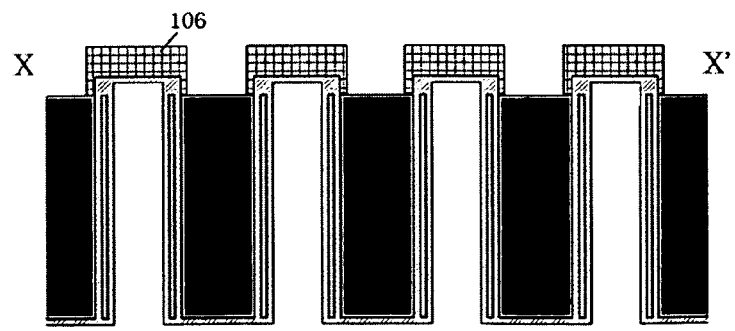
FIG. 39 is an X-X' sectional process diagram for explaining the example of fabrication of the memory cell array according to the invention.
Figure 39:
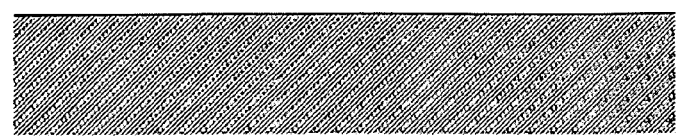
Figure 40:
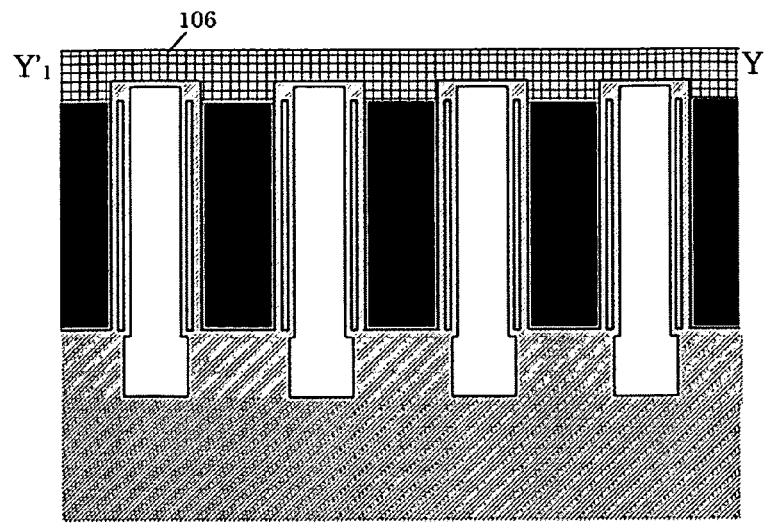
FIG. 40 is a $Y_1$-$Y_1$' sectional process diagram for explaining the example of fabrication of the memory cell array according to the invention.
Figure 41:
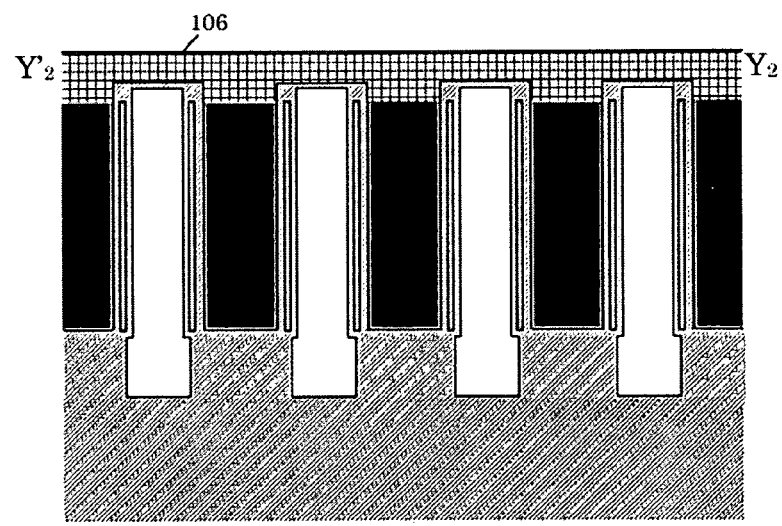
FIG. 41 is a $Y_2$-$Y_2$' sectional process diagram for explaining the example of fabrication of the memory cell array according to the invention.

Then, after the polysilicon film is planarized by CMP, etch-back is performed (FIG. 36 (X-X'), FIG. 37 ($Y_1$-$Y_1$'), and FIG. 38 ($Y_2$-$Y_2$')).

Then, a resist 106 subjected to patterning performed by a publicly known photolithography technique is formed. (FIG. 39 (X-X'), FIG. 40 ($Y_1$-$Y_1$'), and FIG. 41 ($Y_2$-$Y_2$')).

Figure 42:
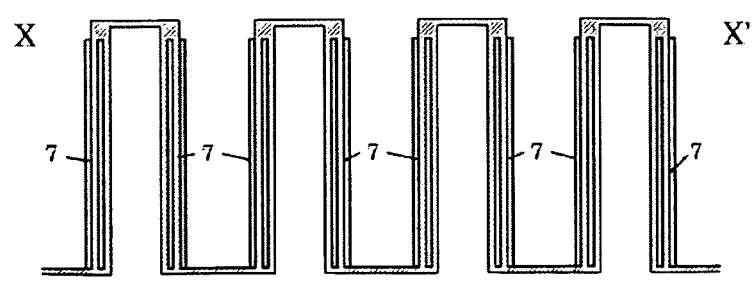
FIG. 42 is an X-X' sectional process diagram for explaining the example of fabrication of the memory cell array according to the invention.
Figure 42:
Figure 43:
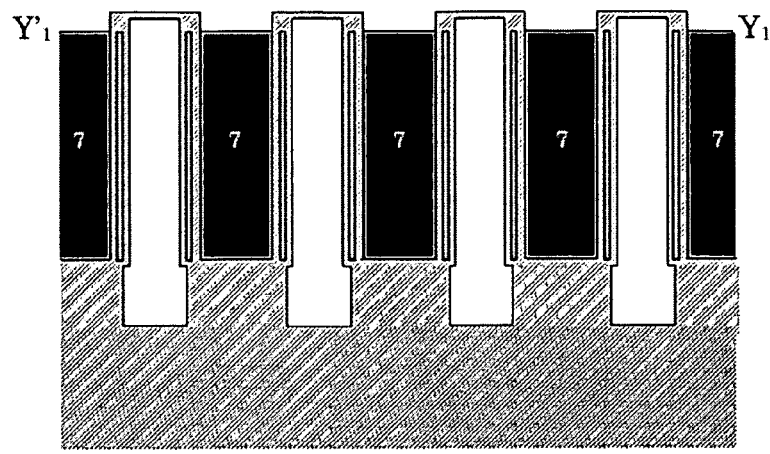
FIG. 43 is a $Y_1$-$Y_1$' sectional process diagram for explaining the example of fabrication of the memory cell array according to the invention.
Figure 44:
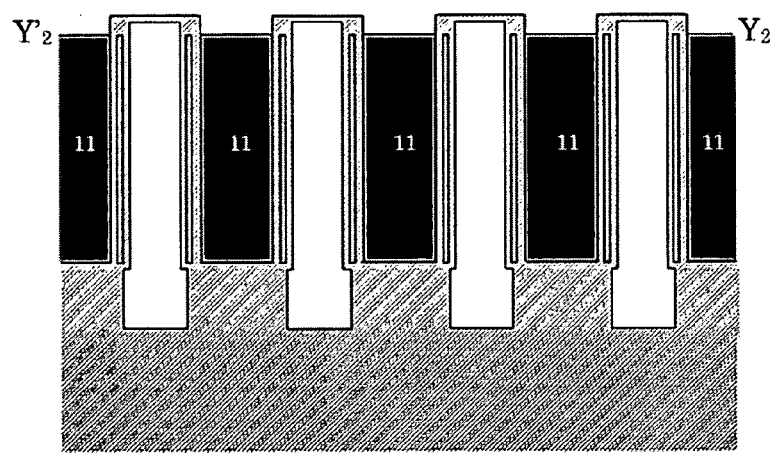
FIG. 44 is a $Y_2$-$Y_2$' sectional process diagram for explaining the example of fabrication of the memory cell array according to the invention.

Then, by using the resist 106 as a mask, the polysilicon film 105 is etched by reactive ion etching so as to be left on the side walls of the charge accumulation layers in the form of a side wall spacer, thereby forming the gate lines 7 and the read lines 11 (FIG. 42 (X-X'), FIG. 43 ($Y_1$-$Y_1$'), and FIG. 44 ($Y_2$-$Y_2$')).

Figure 45:
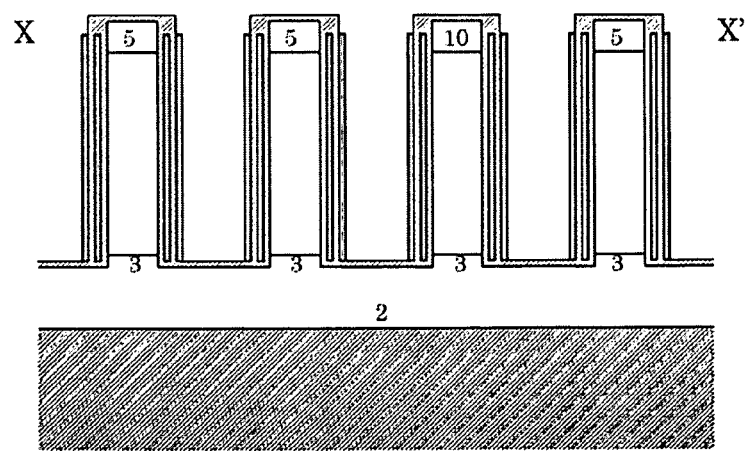
FIG. 45 is an X-X' sectional process diagram for explaining the example of fabrication of the memory cell array according to the invention.
Figure 46:
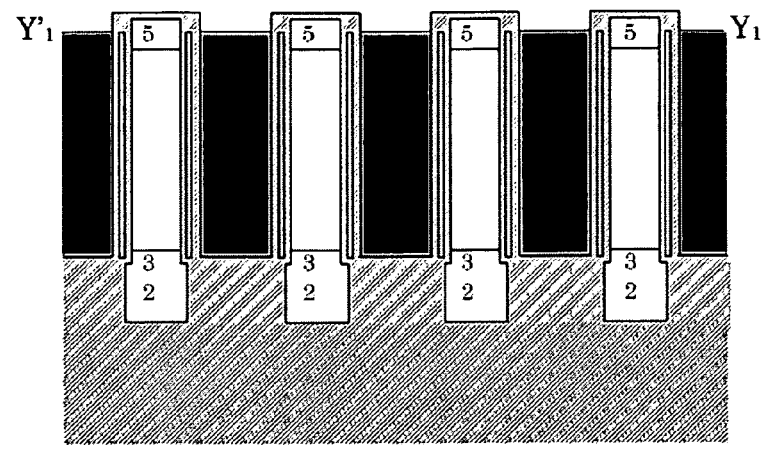
FIG. 46 is a $Y_1$-$Y_1$' sectional process diagram for explaining the example of fabrication of the memory cell array according to the invention.
Figure 47:
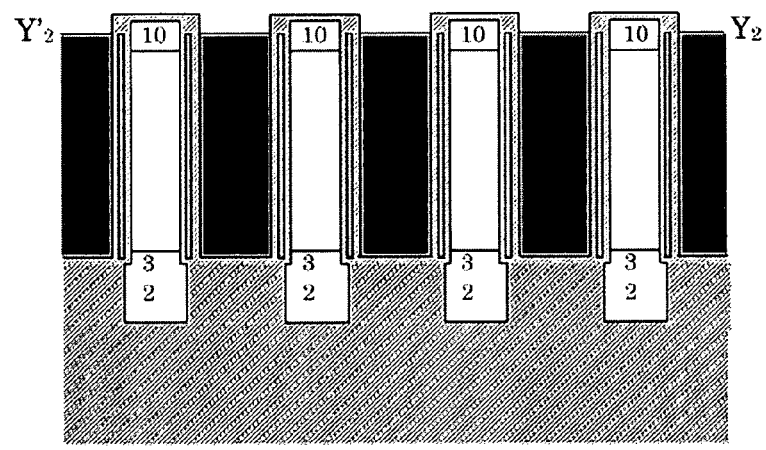
FIG. 47 is a $Y_2$-$Y_2$' sectional process diagram for explaining the example of fabrication of the memory cell array according to the invention.

Then, by an ion implantation procedure or the like, the source lines 2, the source diffusion layers 3, and the drain diffusion layers 5 and 10 are formed (FIG. 45 (X-X'), FIG. 46 ($Y_1$-$Y_1$'), and FIG. 47 ($Y_2$-$Y_2$')).

Figure 48:
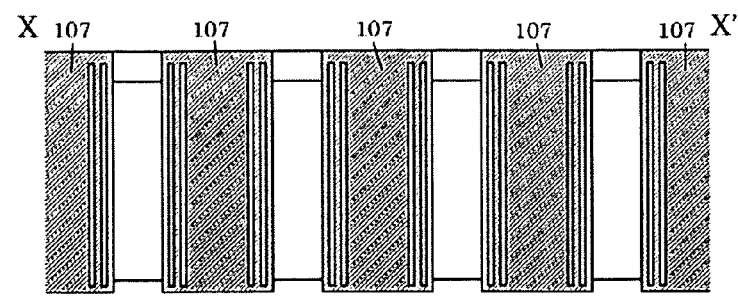
FIG. 48 is an X-X' sectional process diagram for explaining the example of fabrication of the memory cell array according to the invention.
Figure 48:
Figure 49:
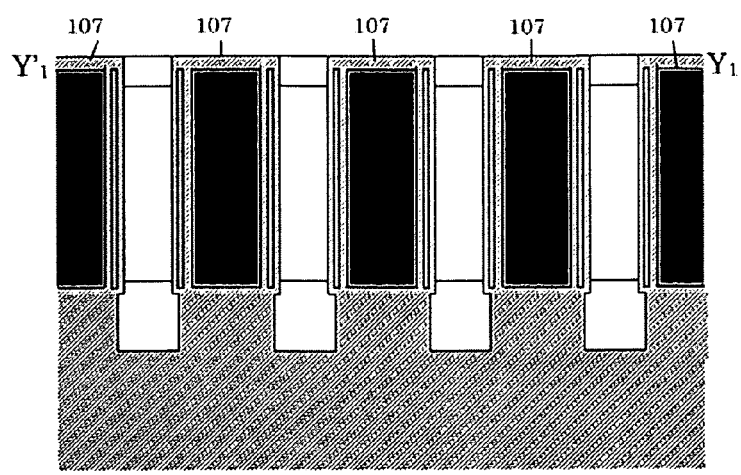
FIG. 49 is a $Y_1$-$Y_1$' sectional process diagram for explaining the example of fabrication of the memory cell array according to the invention.
Figure 50:
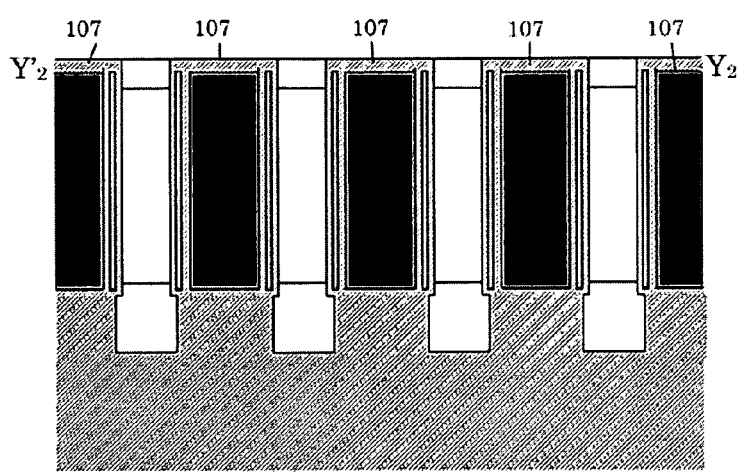
FIG. 50 is a $Y_2$-$Y_2$' sectional process diagram for explaining the example of fabrication of the memory cell array according to the invention.
Figure 51:
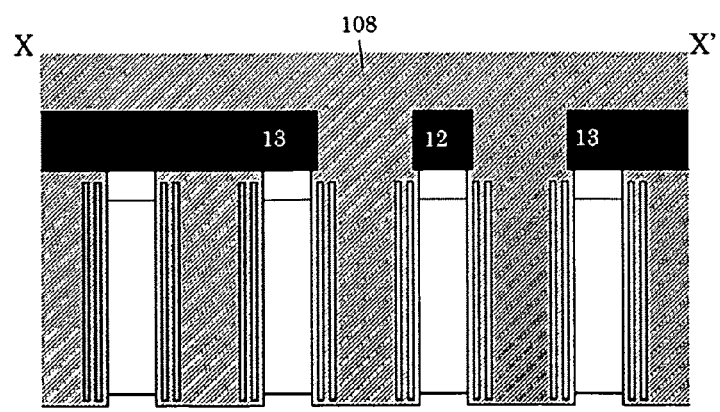
FIG. 51 is an X-X' sectional process diagram for explaining the example of fabrication of the memory cell array according to the invention.
Figure 51:
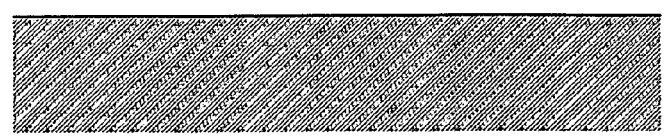
Figure 52:
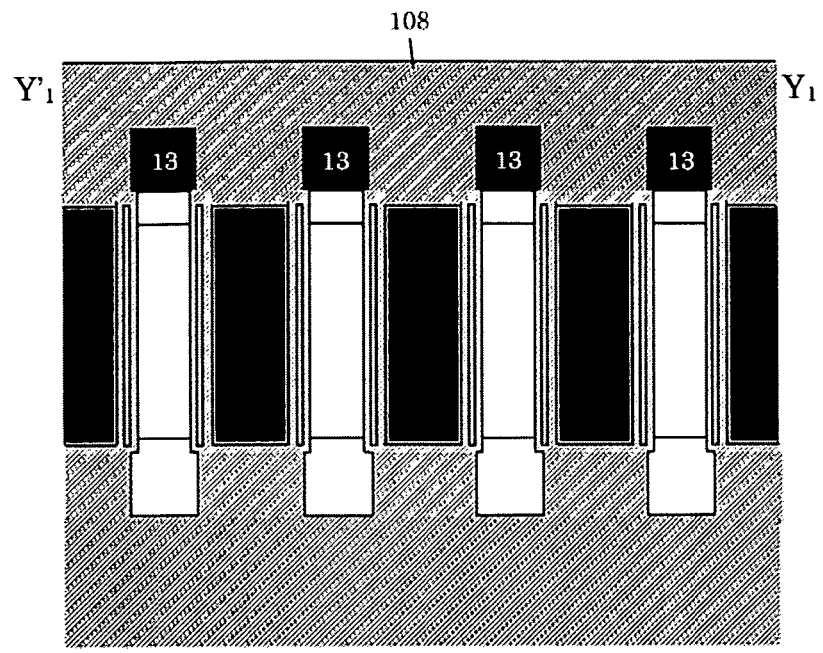
FIG. 52 is a $Y_1$-$Y_1$' sectional process diagram for explaining the example of fabrication of the memory cell array according to the invention.
Figure 53:
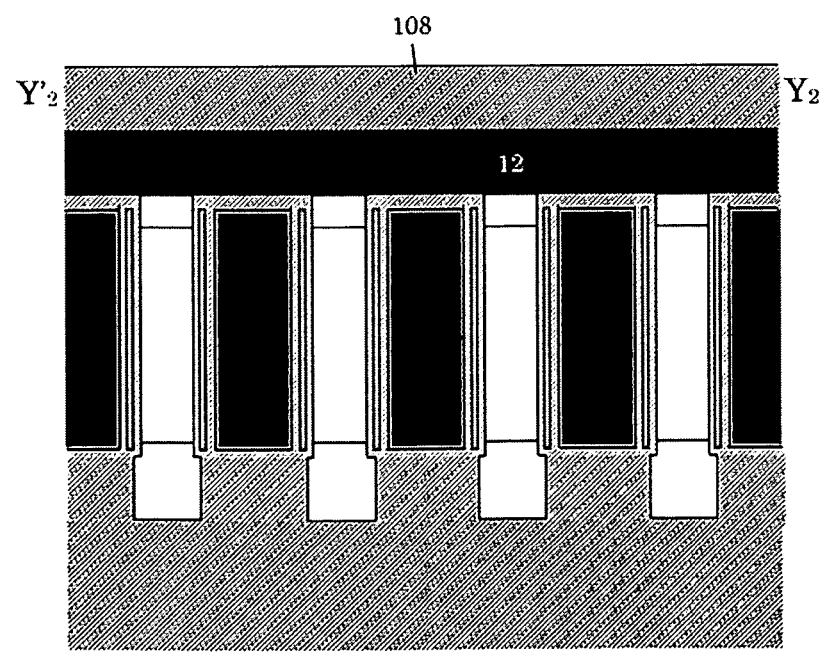
FIG. 53 is a $Y_2$-$Y_2$' sectional process diagram for explaining the example of fabrication of the memory cell array according to the invention.

Then, an interlayer insulation film 107 such as a silicon oxide film is deposited, and the drain diffusion layers are exposed by using CMP or the like (FIG. 48 (X-X'), FIG. 49 ($Y_1$-$Y_1$'), and FIG. 50 ($Y_2$-$Y_2$')).

Then, metal is deposited by sputtering or the like, and the metal is etched by using a resist as a mask, whereby the bit lines 13 and the common source lines 12 are formed. Thereafter, an interlayer insulation film 108 is deposited (FIG. 51 (X-X'), FIG. 52 ($Y_1$-$Y_1$'), and FIG. 53 ($Y_2$-$Y_2$')).

Figure 54:
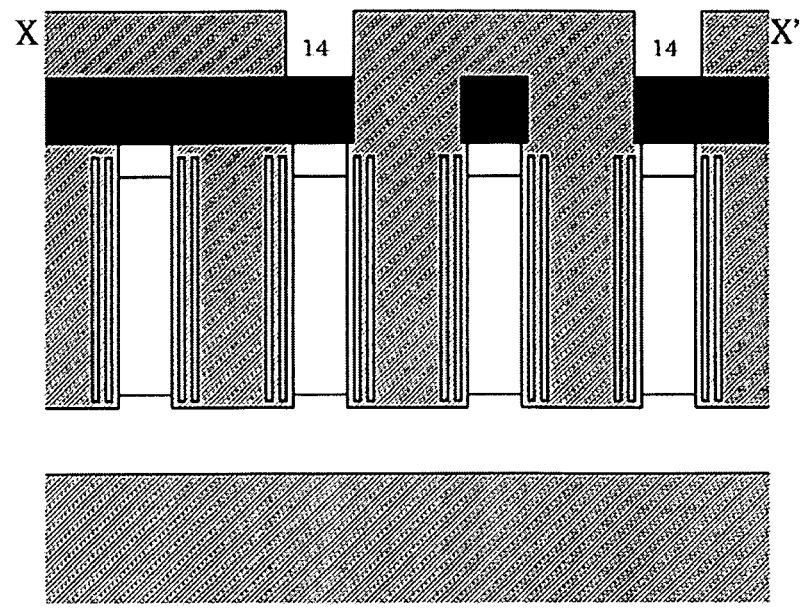
FIG. 54 is an X-X' sectional process diagram for explaining the example of fabrication of the memory cell array according to the invention.
Figure 55:
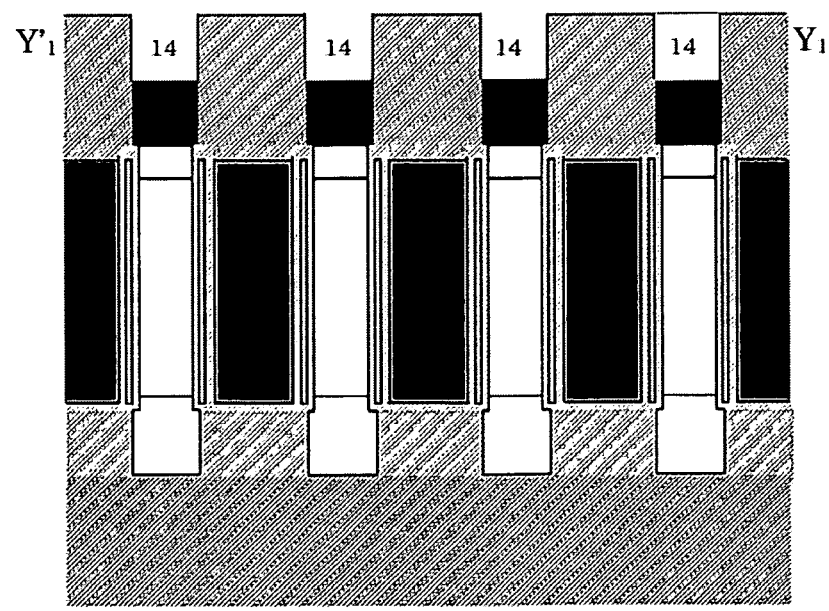
FIG. 55 is a $Y_1$-$Y_1$' sectional process diagram for explaining the example of fabrication of the memory cell array according to the invention.
Figure 56:
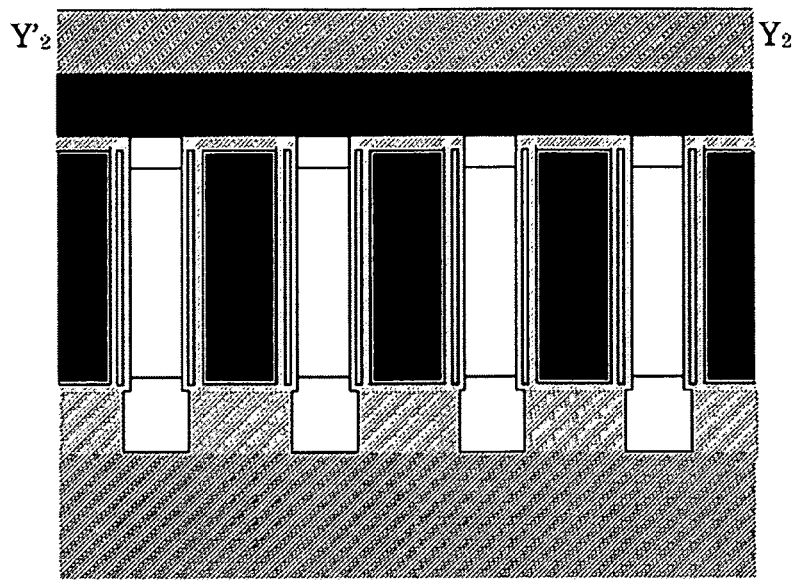
FIG. 56 is a $Y_2$-$Y_2$' sectional process diagram for explaining the example of fabrication of the memory cell array according to the invention.
Figure 57:
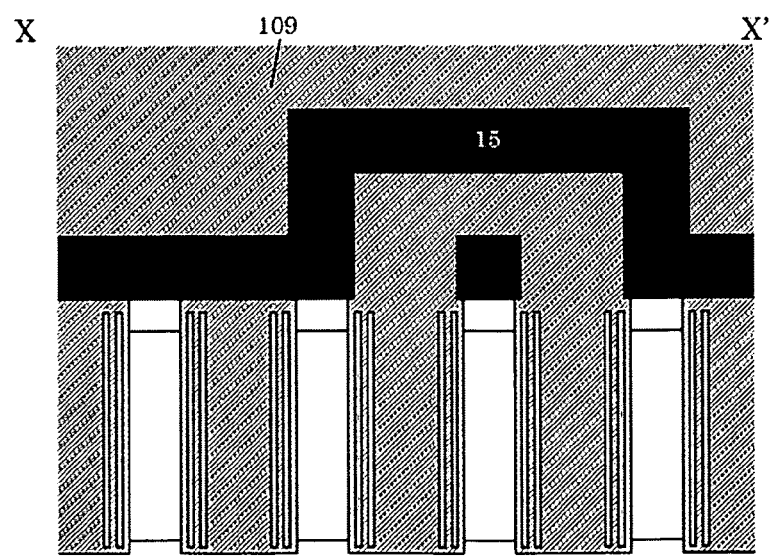
FIG. 57 is an X-X' sectional process diagram for explaining the example of fabrication of the memory cell array according to the invention.
Figure 58:
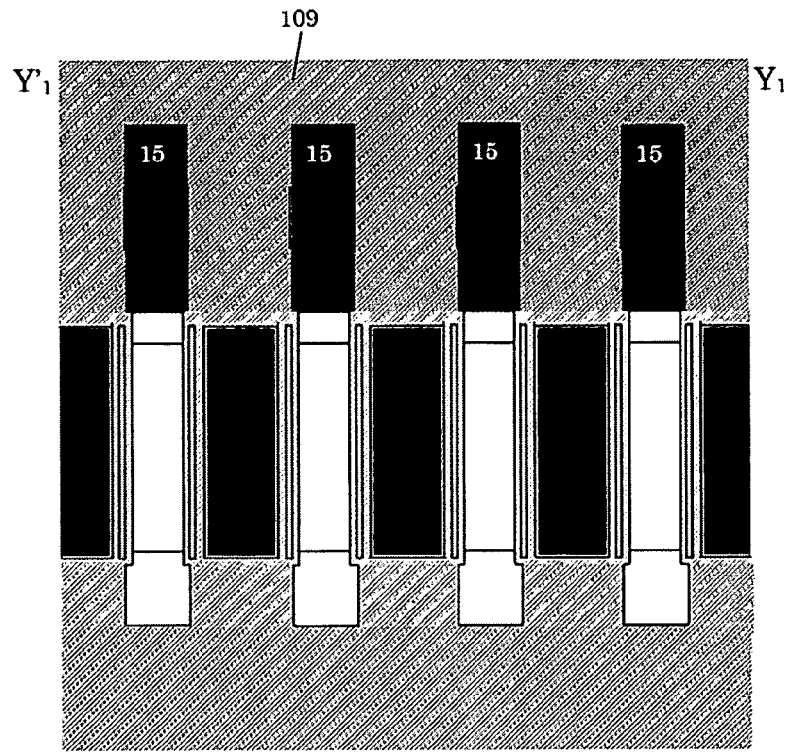
FIG. 58 is a $Y_1$-$Y_1$' sectional process diagram for explaining the example of fabrication of the memory cell array according to the invention.
Figure 59:
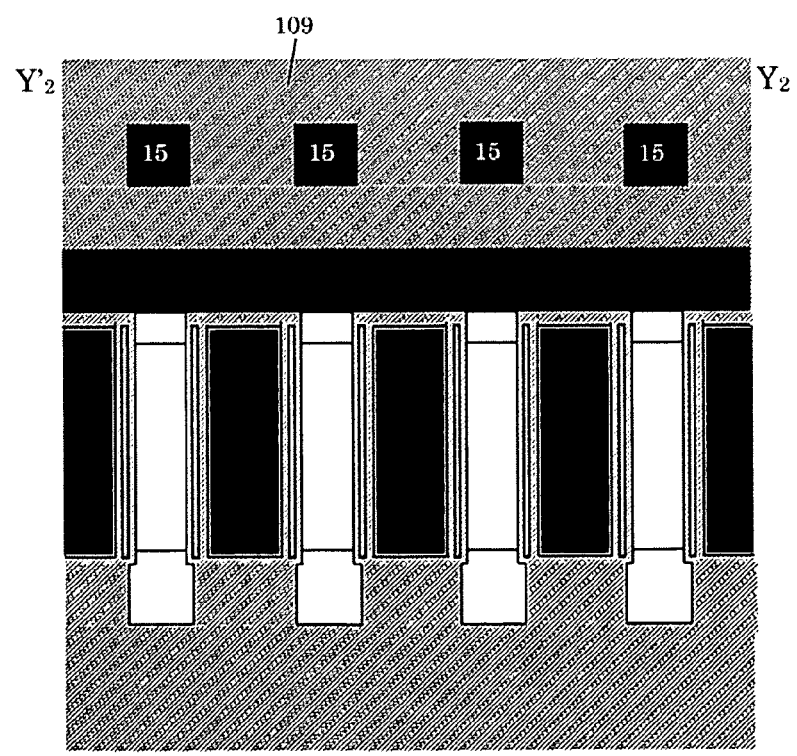
FIG. 59 is a $Y_2$-$Y_2$' sectional process diagram for explaining the example of fabrication of the memory cell array according to the invention.

Then, by using a resist as a mask, the interlayer insulation film is etched, whereby the vias 14 are formed (FIG. 54 (X-X'), FIG. 55 ($Y_1$-$Y_1$'), and FIG. 56 ($Y_2$-$Y_2$')).

Then, metal is deposited by sputtering or the like, and, by using a resist as a mask, the metal is etched, whereby the bit lines 15 are formed. Thereafter, an interlayer insulation film 109 is deposited (FIG. 57 (X-X'), FIG. 58 ($Y_1$-$Y_1$'), and FIG. 59 ($Y_2$-$Y_2$')). In this way, the structure of the nonvolatile semiconductor memory cell array of the invention is formed, and the structure in which the gate lines are laid out in rows, the bit lines are laid out in columns, the source lines are laid out in columns, and the common source lines are laid out in rows is achieved.

Hereinafter, a method for driving the nonvolatile semiconductor memory cell array of the invention will be explained with reference to FIGS. 60 to 65.

Figure 60:
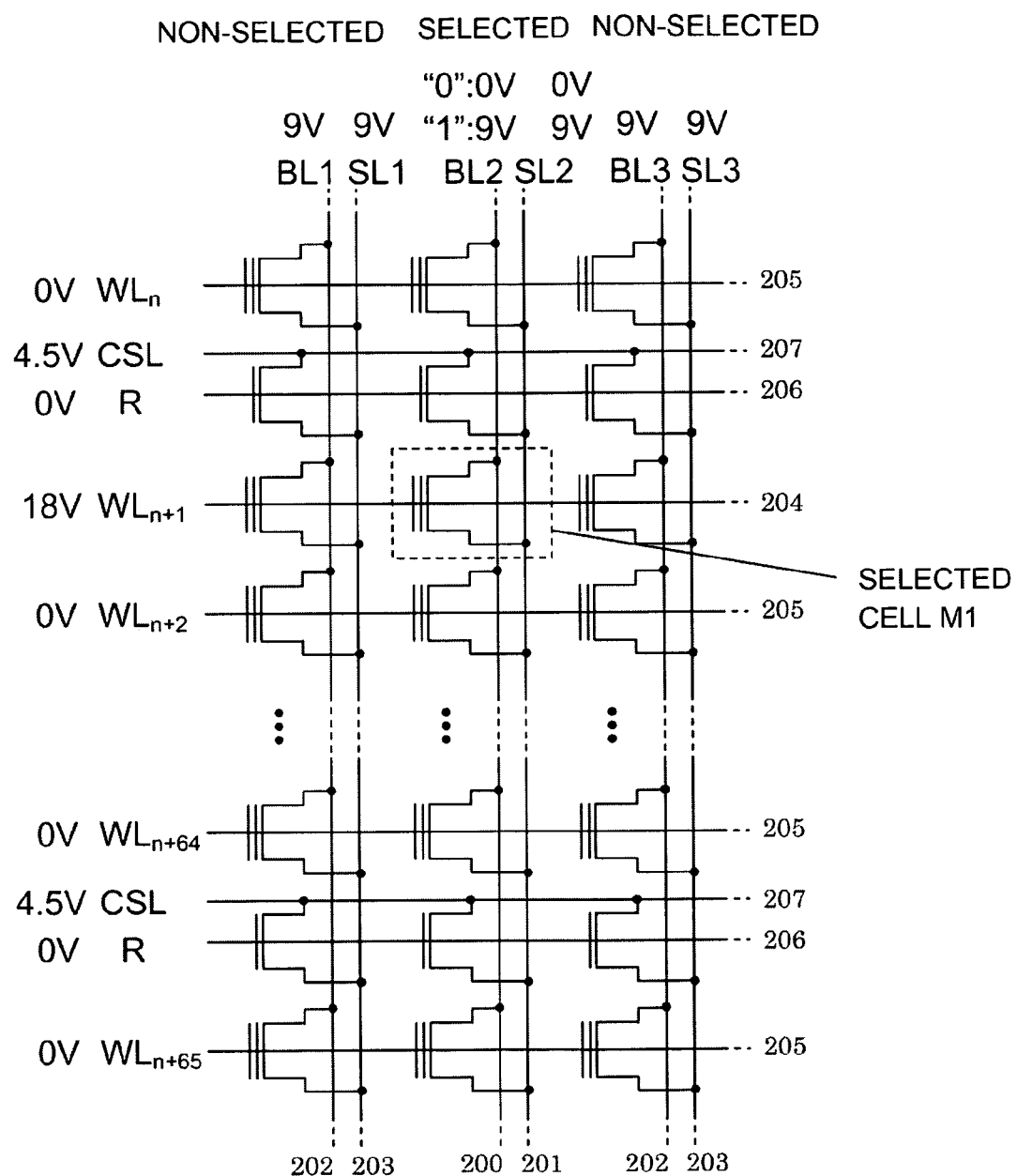
FIG. 60 is a diagram for explaining a relation among the potentials at the time of data writing.

Injection (writing) of electric charge into the charge accumulation layer of a selected memory cell M1 by the FN tunnel current is performed as shown in FIG. 60. To a selected bit line 200 and a selected source line 201, 0 V or a voltage (9 V) which is enough to block writing is applied, to non-selected bit lines 202 and non-selected source lines 203, the voltage (9 V) which is enough to block writing is applied, to a selected gate line 204, high voltage (18 V) is applied, and to non-selected gate lines 205, 0 V is applied. By performing the operations described above, it is possible to inject electric charge into the charge accumulation layer by using the FN tunnel current. At this point, by applying 0 V to read lines 206 (corresponding to the read lines 11 shown in FIGS. 5 to 7), the source lines and the common source lines are electrically isolated from each other. In addition, by applying, to common source lines 207, half (4.5 V) the voltage (9 V) which is enough to block writing, it is possible to make the withstand voltage between the source-drain of the transistor connecting the common source line and the source line equal to half (4.5 V) the voltage (9 V) which is enough to block writing.

Figure 61:
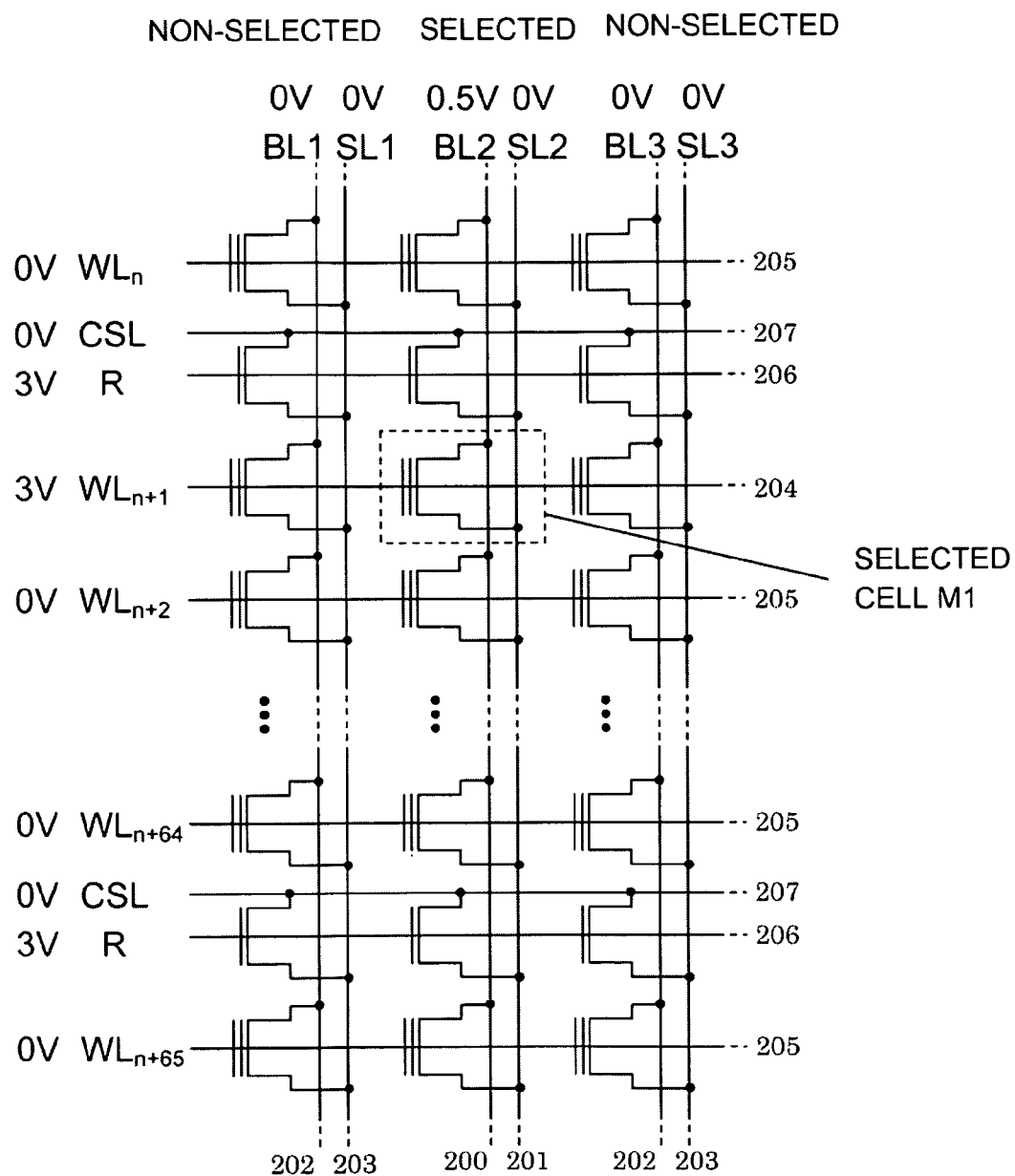
FIG. 61 is a diagram for explaining a relation among the potentials at the time of data reading.

Reading of data from a selected memory cell M1 is performed as shown in FIG. 61. By applying a voltage (3 V) to a selected gate line 204, applying 0 V to non-selected gate lines 205, applying 0 V to the source lines 201 and 203, and applying a voltage (0.5 V) to a selected bit line 200, it is possible to read the selected memory cell. At this point, by applying 0 V to non-selected bit lines 202 and the common source lines 207 and applying a voltage (3 V) to the read lines 206, the source lines are connected to the common source lines via the transistors disposed at intervals of more than one memory cell connected to the bit line and the source line, whereby it is possible to lower the resistance of the source diffusion layer and therefore achieve high-speed reading.

Figure 62:
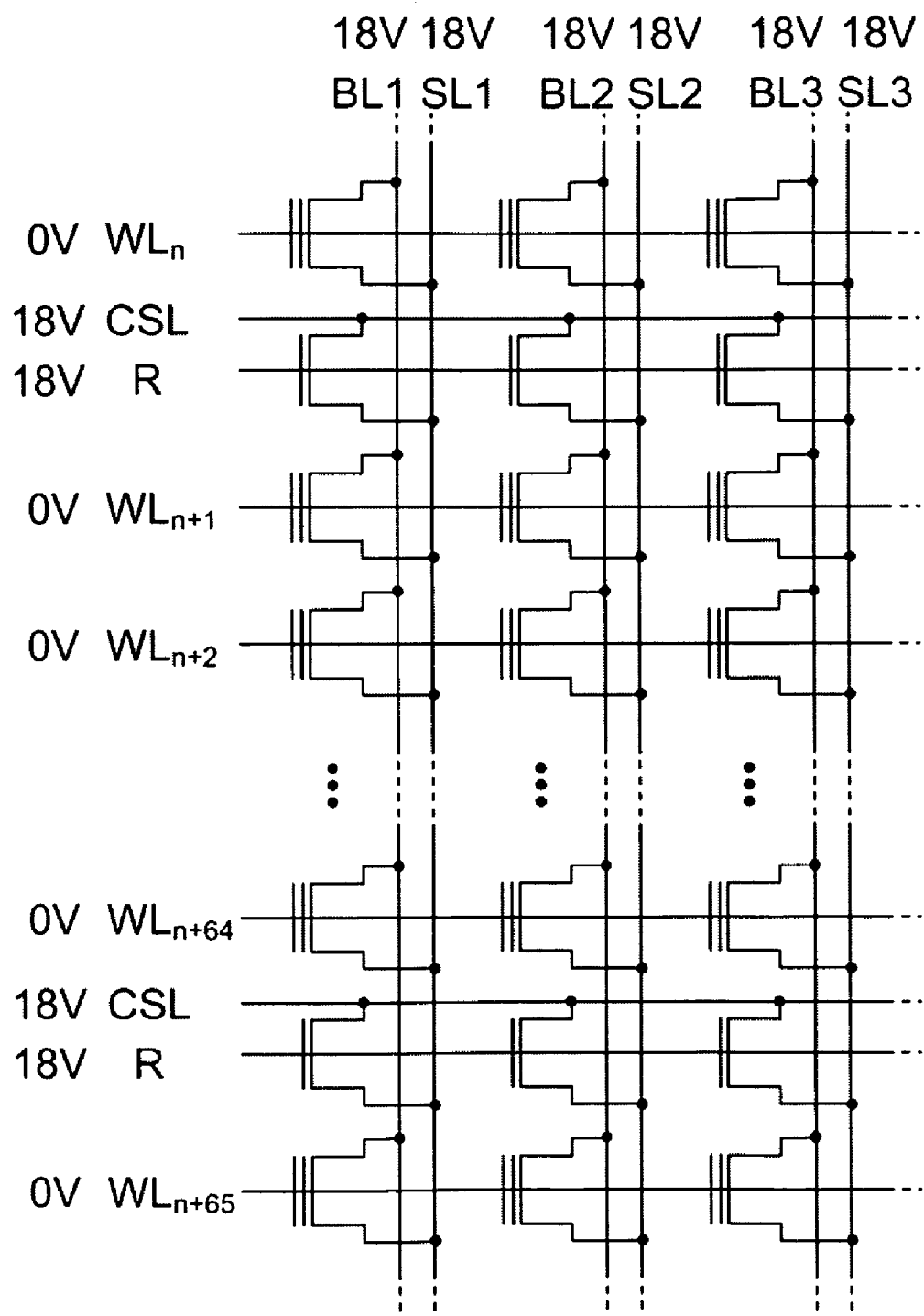
FIG. 62 is a diagram for explaining a relation among the potentials at the time of erasing of all the memory cells.

Releasing (erasing) of electric charge from the charge accumulation layers of all the memory cells of the memory cell array by the FN tunnel current is performed as shown in FIG. 62. By applying an erasing voltage (18 V) to all the bit lines and all the source lines, applying 0 V to all the gate lines, and applying a voltage (18 V) that is the same as the erasing voltage to all the common source lines and the read lines, it is possible to release the electric charge from the charge accumulation layers of all the memory cells through the use of the FN tunnel current.

Figure 63:
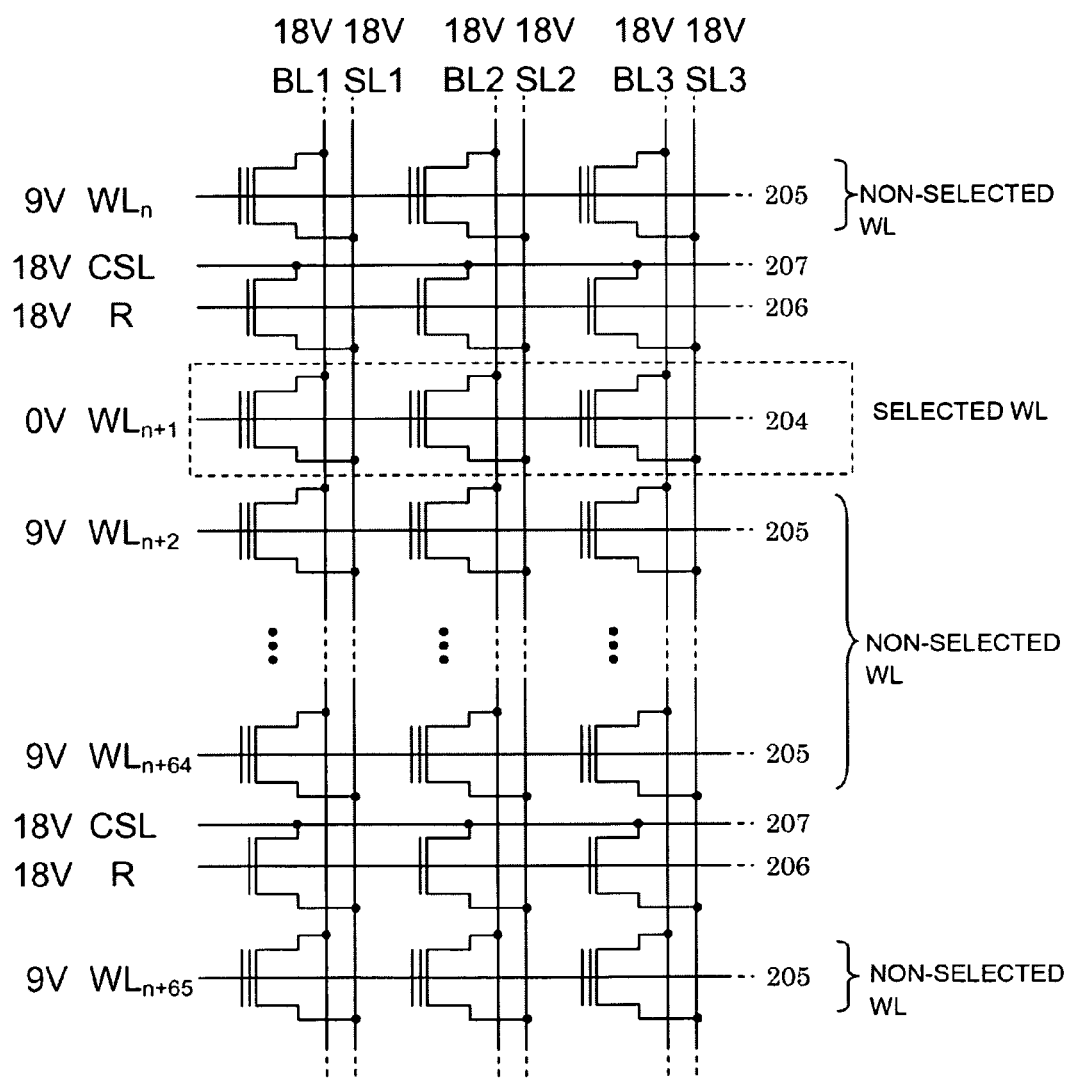
FIG. 63 is a diagram for explaining a relation among the potentials at the time of erasing of a memory cell connected to a selected gate line.

Releasing (erasing) of electric charge from the charge accumulation layers of the memory cells connected to a selected gate line of the memory cell array by the FN tunnel current is performed as shown in FIG. 63. By applying an erasing voltage (18 V) to all the bit lines and the source lines, applying 0 V to a selected gate line 204, applying a voltage (9 V) which is enough to block erasing to non-selected gate lines 205, applying a voltage (18 V) that is the same as the erasing voltage to the common source lines 207 and the read lines 206, it is possible to release the electric charge from the charge accumulation layers of the memory cells connected to the selected gate line through the use of the FN tunnel current.

Figure 64:
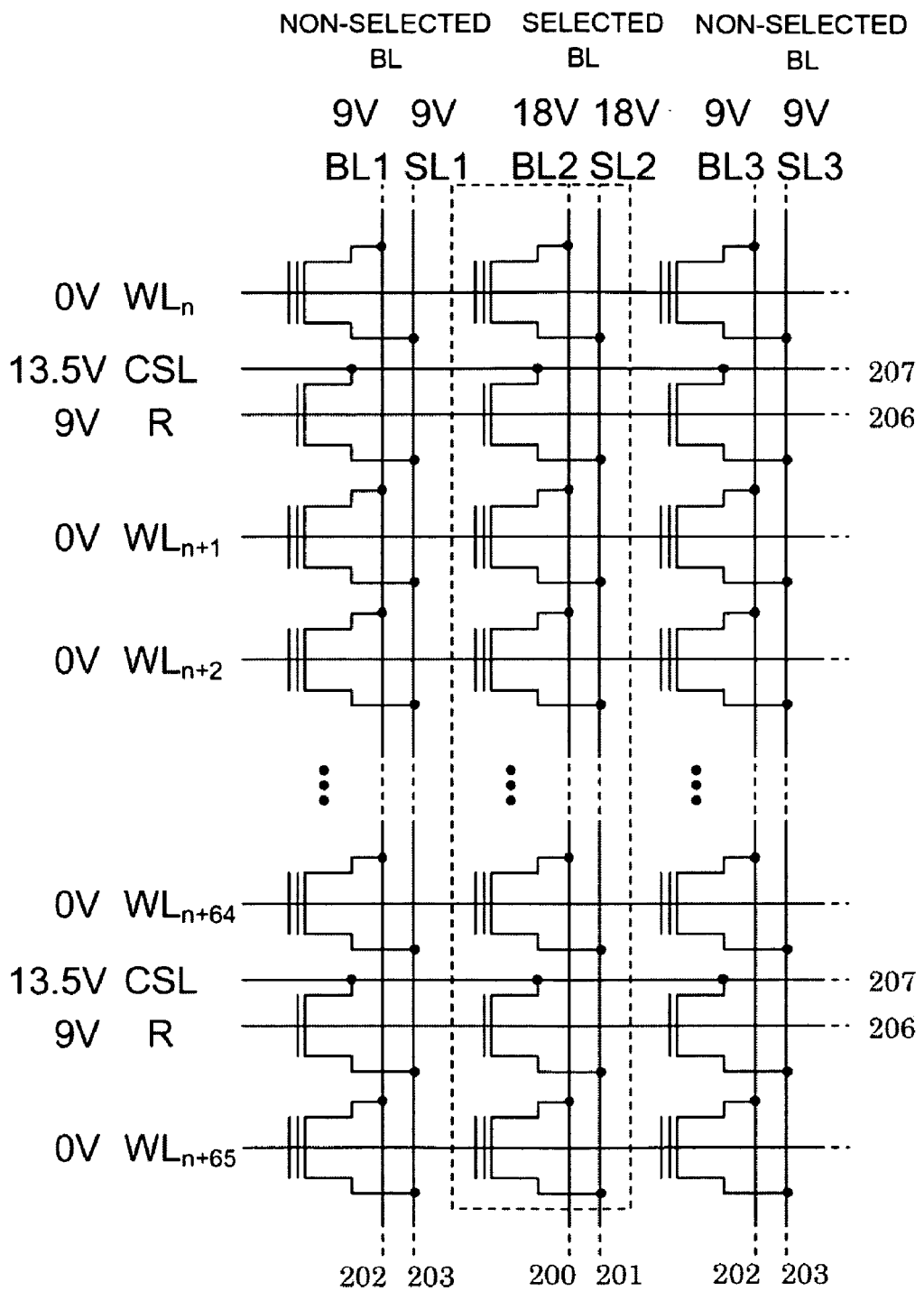
FIG. 64 is a diagram for explaining a relation among the potentials at the time of erasing of a memory cell connected to a selected bit line.

Releasing (erasing) of electric charge from the charge accumulation layers of the memory cells connected to a selected bit line of the memory cell array by the FN tunnel current is performed as shown in FIG. 64. By applying an erasing voltage (18 V) to a selected bit line 200 and a selected source line 201, applying a voltage (9 V) which is enough to block erasing to non-selected bit lines 202 and non-selected source lines 203, applying 0 V to all the gate lines, applying a voltage (9 V) to the read lines 206, and applying, to the common source lines 207, a voltage (13.5 V) which is half the sum of the erasing voltage (18 V) and the voltage (9 V) which is enough to block erasing, it is possible to release the electric charge from the charge accumulation layers of the memory cells connected to the selected bit line through the use of the FN tunnel current.

Figure 65:
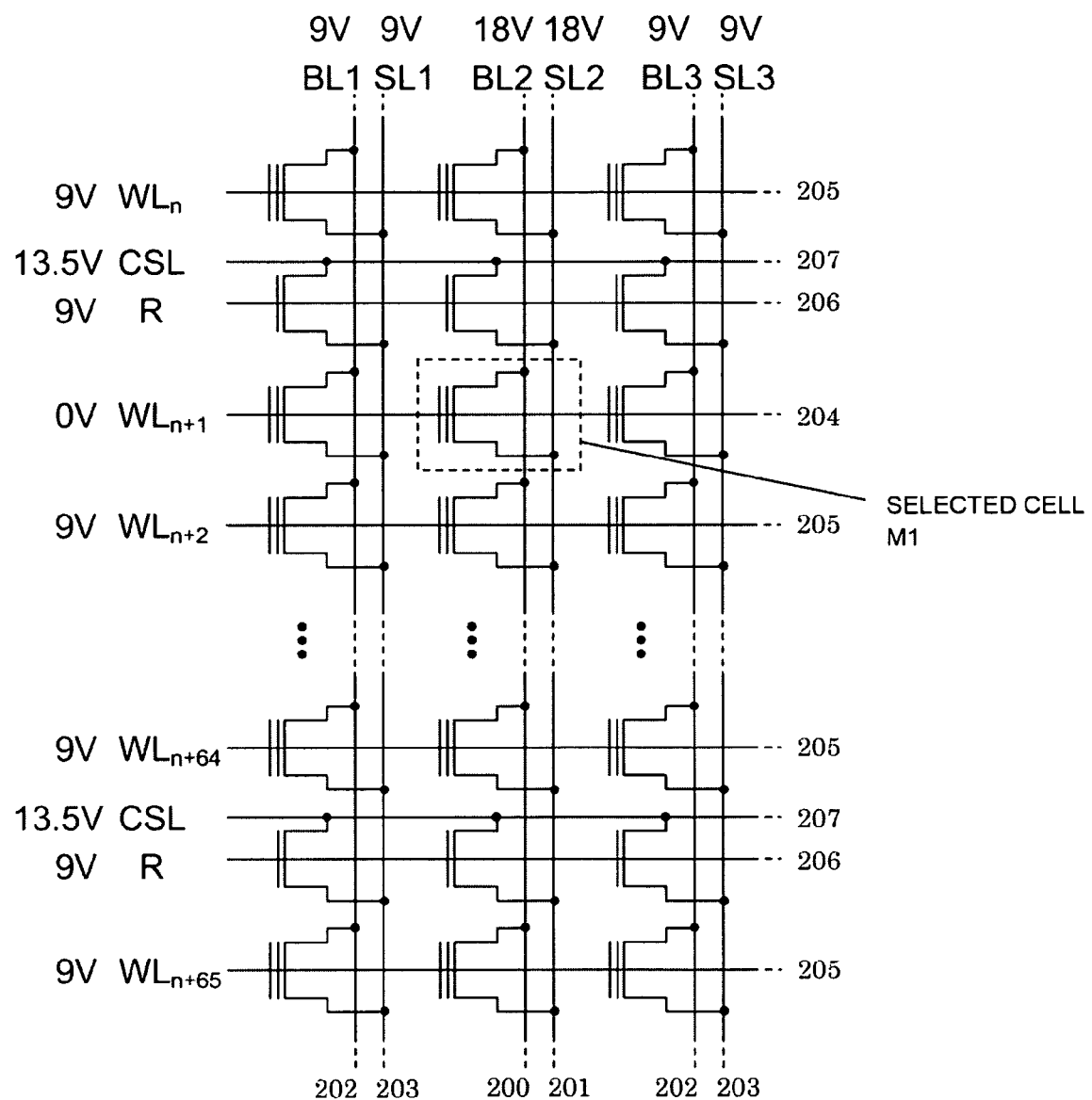
FIG. 65 is a diagram for explaining a relation among the potentials at the time of erasing of a selected memory cell.

Releasing (erasing) of electric charge from the charge accumulation layer of a selected memory cell M1 of the memory cell array by the FN tunnel current is performed as shown in FIG. 65. By applying an erasing voltage (18 V) to a selected bit line 200 and a selected source line 201, applying a voltage (9 V) which is enough to block erasing to non-selected bit lines 202 and non-selected source lines 203, applying 0 V to a selected gate line 204, applying a voltage (9 V) which is enough to block erasing to non-selected gate lines 205, applying a voltage (9 V) to the read lines 206, and applying, to the common source lines 207, a voltage (13.5 V) which is half the sum of the erasing voltage (18 V) and the voltage (9 V) which is enough to block erasing, it is possible to release the electric charge from the charge accumulation layer of the selected memory cell through the use of the FN tunnel current.

Figure 66:
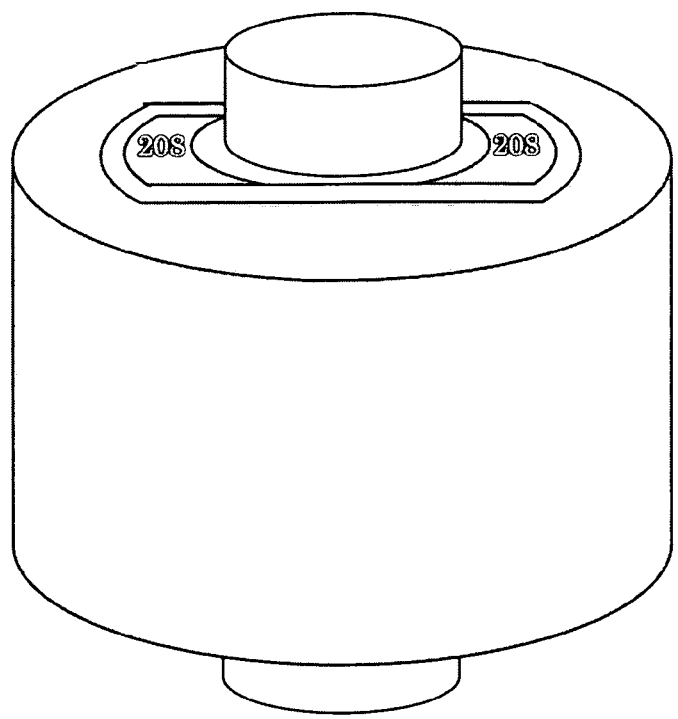
FIG. 66 is a bird's eye view of another example according to the invention.
Figure 67:
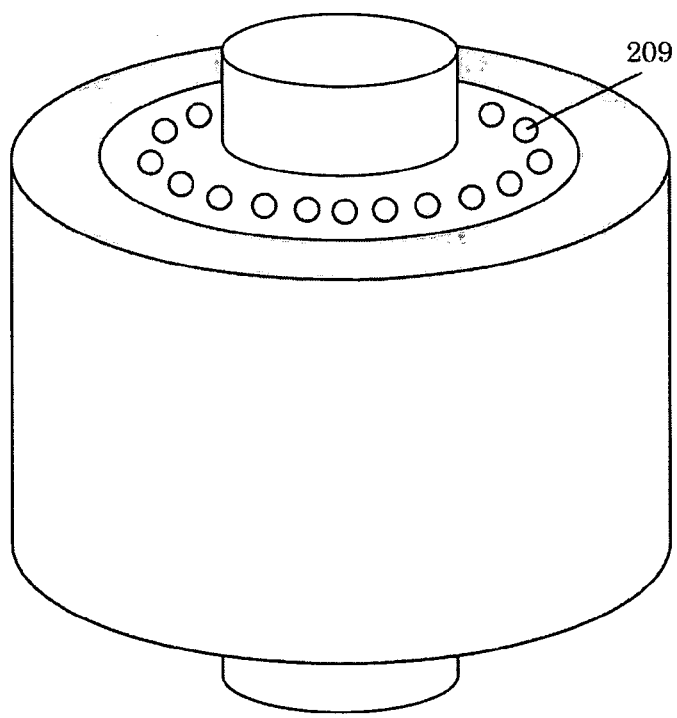
FIG. 67 is a bird's eye view of another example according to the invention.
Figure 68:
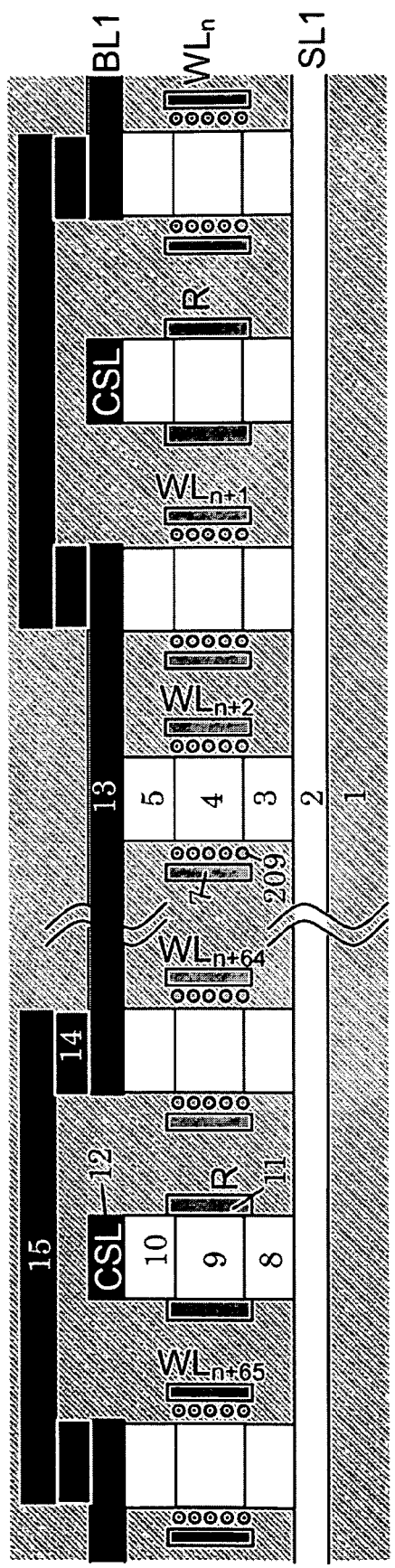
FIG. 68 is a sectional view of another example according to the invention.

In addition, although the example uses a memory cell having a structure with a single charge accumulation layer surrounding an island semiconductor via a gate insulation film on the channel region of the side wall of an island semiconductor layer, the side wall being sandwiched between a drain diffusion layer and a source diffusion layer, the charge accumulation layer does not necessarily need to be a single charge accumulation layer; as shown in FIG. 66, more than one charge accumulation layer 208 may surround part on the channel region of the side wall of the island semiconductor. Moreover, it is also possible to use a nonvolatile semiconductor memory cell (FIG. 67) having a structure provided with, between a control gate and an island semiconductor layer, more than one particulate charge accumulation layer 209 or a region that can accumulate electric charge, the structure that can perform writing and erasing by the FN tunnel current (FIG. 68).

What is claimed is:

1. A nonvolatile semiconductor memory including a plurality of memory cells each comprising:
    a source region, a channel region, and a drain region thereon in this order extending from a surface of the substrate in a direction perpendicular to the surface of the substrate and further including a charge accumulation layer, via a gate insulation film, on an outside surface of the channel region and a control gate formed, via an insulation layer, on an outside surface of the charge accumulation layer so as to cover the charge accumulation layer, the memory cells arranged on the substrate in a matrix with n rows and m columns and further comprising:
    a plurality of source lines laid out in a column direction and connecting the source regions of the memory cells with each other;
    a plurality of parallel bit lines laid out in the column direction in a layer different from the source lines and connecting the drain regions of the memory cells with each other;
    a plurality of gate lines laid out in a row direction that is substantially perpendicular to the column direction and connecting the control gates of the memory cells with each other;
    a plurality of transistors comprising a switch for electrically connecting a common source line to the plurality of source lines and for electrically disconnecting the common source line from the plurality of source lines, wherein one row of transistors is formed at intervals of p (p<n) rows of the matrix, the transistors each having a source region, a channel region, and a drain region formed in this order from a surface of the substrate in a direction perpendicular to the surface of the substrate, each source region being connected to the source line of a column to which the source region belongs;
read lines laid out in the row direction and connecting gates of the transistors with each other, the transistors aligned in a same row; and
wherein the common source lines connect the drain regions of the transistors with each other, the transistors being aligned in the same row.

2. The nonvolatile semiconductor memory according to claim 1, wherein the source region, the channel region, and the drain region of the each transistor are formed concurrently with the source region, the channel region, and the drain region, respectively, of the each memory cell.

3. A method for writing into the nonvolatile semiconductor memory according to claim 1, the method comprising:
applying 0 V or a positive first voltage to a selected bit line and a selected source line;
applying the positive first voltage to a non-selected bit line and a non-selected source line;
applying a positive second voltage to a selected gate line;
applying 0 V to a non-selected gate line;
applying 0 V to the read lines; and
applying a positive third voltage which is half the positive first voltage to the common source lines, electric charge is injected into the charge accumulation layer of a selected memory cell through a use of an FN tunnel current.

4. A method for reading the nonvolatile semiconductor memory according to claim 1, the method comprising:
applying a positive first voltage to a selected gate line;
applying 0 V to a non-selected gate line;
applying 0 V to the source lines;
applying a positive second voltage to a selected bit line;
applying 0 V to a non-selected bit line and a common source line; and
applying a positive third voltage to the read lines, data is read from a selected memory cell.

5. A method for erasing the nonvolatile semiconductor memory according to claim 1, the method comprising:
applying a positive first voltage to all the bit lines and all the source lines, applying 0 V to all gate lines; and
applying the positive first voltage to all the common source lines and the read lines, data of all the memory cells is erased at a time.

6. A method for erasing the nonvolatile semiconductor memory according to claim 1, the method comprising:
applying a positive first voltage to all the bit lines and the source lines;
applying 0 V to a selected gate line;
applying a positive second voltage to a non-selected gate line; and
applying the positive first voltage to all the common source lines and the read lines, data of the memory cells connected to the selected gate line is erased at a time.

7. A method for erasing the nonvolatile semiconductor memory according to claim 1, the method comprising:
applying a positive first voltage to a selected bit line and a selected source line;
applying a positive second voltage to a non-selected bit line and a non-selected source line;
applying 0 V to all gate lines;
applying the positive second voltage to all the read lines; and
applying a positive third voltage which is half a sum of the positive first voltage and the positive second voltage to all the common source lines, data of the memory cells connected to the selected bit line is erased at a time.

8. A method for erasing the nonvolatile semiconductor memory according to claim 1, the method comprising:
applying a positive first voltage to a selected bit line and a selected source line;
applying a positive second voltage to a non-selected bit line and a non-selected source line;
applying 0 V to a selected gate line;
applying the positive second voltage to a non-selected control gate line;
applying the positive second voltage to the read lines; and
applying a positive third voltage which is half a sum of the positive first voltage and the positive second voltage to the common source lines, data of a selected memory cell is erased.

9. A nonvolatile semiconductor memory including a plurality of memory cells each comprising:
a source region, a channel region, and a drain region thereon in this order extending from a surface of the substrate in a direction perpendicular to the surface of a substrate and further including a charge accumulation layer via a gate insulation film, on an outside surface of the channel region and a control gate formed, via an insulation layer, on an outside surface of the charge accumulation layer so as to cover the charge accumulation layer, the memory cells arranged on the substrate in a matrix with n rows and m columns, and further comprising:
a plurality of source lines laid out in a column direction and connecting the source regions of the memory cells with each other;
a plurality of parallel bit lines laid out in the column direction in a layer different from the source lines and connecting the drain regions of the memory cells with each other;
a plurality of gate lines laid out in a row direction that is substantially perpendicular to the column direction and connecting the control gates of the memory cells with each other;
a plurality of transistors comprising a switch for electrically connecting a common source line to the plurality of source lines and for electrically disconnecting the common source line from the plurality of source lines, wherein one row of transistors is formed at intervals of p (p<n) rows of the matrix, the transistors each having a source region, a channel region, and a drain region formed in this order from a surface of the substrate in a direction perpendicular to the surface of the substrate, each source region being connected to the source line of a column to which the source region belongs;
read lines laid out in the row direction and connecting gates of the transistors with each other, the transistors aligned in a same row; and
wherein the common source lines connect the drain regions of the transistors with each other, the transistors being aligned in the same row, wherein the source region, the channel region, and the drain region of the each transistor are formed concurrently with the source region, the channel region, and the drain region, respectively, of the each memory cell.

10. A method for writing into the nonvolatile semiconductor memory according to claim 9, the method comprising:
applying 0 V or a positive first voltage to a selected bit line and a selected source line, applying the positive first voltage to a non-selected bit line and a non-selected source line;

applying a positive second voltage to a selected gate line, applying 0 V to a non-selected gate line, applying 0 V to the read lines; and applying a positive third voltage which is half the positive first voltage to the common source lines, electric charge is injected into the charge accumulation layer of a selected memory cell through a use of an FN tunnel current.

11. A method for reading the nonvolatile semiconductor memory according to claim 9, the method comprising:

applying a positive first voltage to a selected gate line;
applying 0 V to a non-selected gate line;
applying 0 V to the source lines, applying a positive second voltage to a selected bit line, applying 0 V to a non-selected bit line and a common source line; and
applying a positive third voltage to the read lines, data is read from a selected memory cell.

12. A method for erasing the nonvolatile semiconductor memory according to claim 9, the method comprising:

applying a positive first voltage to all the bit lines and all the source lines;
applying 0 V to all gate lines; and
applying the positive first voltage to all the common source lines and the read lines, data of all the memory cells is erased at a time.

13. A method for erasing the nonvolatile semiconductor memory according to claim 9, the method comprising:

applying a positive first voltage to all the bit lines and the source lines;
applying 0 V to a selected gate line;
applying a positive second voltage to a non-selected gate line; and applying the positive first voltage to all the common source lines and the read lines, data of the memory cells connected to the selected gate line is erased at a time.

14. A method for erasing the nonvolatile semiconductor memory according to claim 9, the method applying a positive first voltage to a selected bit line and a selected source line;
applying a positive second voltage to a non-selected bit line and a non-selected source line, applying 0 V to all gate lines;
applying the positive second voltage to all the read lines; and
applying a positive third voltage which is half a sum of the positive first voltage and the positive second voltage to all the common source lines, data of the memory cells connected to the selected bit line is erased at a time.

15. A method for erasing the nonvolatile semiconductor memory according to claim 9, the method comprising:

applying a positive first voltage to a selected bit line and a selected source line;
applying a positive second voltage to a non-selected bit line and a non-selected source line, applying 0 V to a selected gate line;
applying the positive second voltage to a non-selected control gate line;
applying the positive second voltage to the read lines; and
applying a positive third voltage which is half a sum of the positive first voltage and the positive second voltage to the common source lines, data of a selected memory cell is erased.

* * * * *